US011658104B2

(12) United States Patent
Hsu et al.

(10) Patent No.: US 11,658,104 B2
(45) Date of Patent: May 23, 2023

(54) INTERMEDIATE SUBSTRATE AND FABRICATION METHOD THEREOF

(71) Applicant: PHOENIX PIONEER TECHNOLOGY CO., LTD., Hsinchu County (TW)

(72) Inventors: Shih-Ping Hsu, Hsinchu County (TW); Chu-Chin Hu, Hsinchu County (TW); Pao-Hung Chou, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 17/679,245

(22) Filed: Feb. 24, 2022

(65) Prior Publication Data

US 2022/0285257 A1 Sep. 8, 2022

(30) Foreign Application Priority Data

Mar. 4, 2021 (TW) .................. 110107729

(51) Int. Cl.
| | | |
|---|---|---|
| H01L 21/48 | (2006.01) | |
| H01L 23/498 | (2006.01) | |
| H05K 3/46 | (2006.01) | |
| H05K 1/02 | (2006.01) | |
| H05K 1/11 | (2006.01) | |
| H05K 3/42 | (2006.01) | |
| H01L 23/00 | (2006.01) | |
| H01L 21/56 | (2006.01) | |

(52) U.S. Cl.
CPC ...... *H01L 23/49822* (2013.01); *H01L 21/486* (2013.01); *H01L 21/4857* (2013.01); *H01L 23/49816* (2013.01); *H01L 23/49833* (2013.01); *H01L 23/49838* (2013.01); *H01L 23/49866* (2013.01); *H05K 1/0271* (2013.01); *H05K 1/116* (2013.01); *H05K 3/424* (2013.01); *H05K 3/429* (2013.01); *H05K 3/4682* (2013.01); *H01L 21/563* (2013.01); *H01L 24/16* (2013.01); *H01L 2224/16235* (2013.01); *H01L 2924/3511* (2013.01)

(58) Field of Classification Search
CPC ... H01L 21/48; H01L 21/4857; H01L 21/486; H01L 23/49822; H01L 23/49833; H01L 23/49816; H01L 23/49838; H01L 23/49866
USPC ........................................................ 174/255
See application file for complete search history.

(56) References Cited

U.S. PATENT DOCUMENTS

| 11,476,204 B2 * | 10/2022 | Chou ..................... H01L 21/563 |
| 2021/0057331 A1 * | 2/2021 | Hou ........................ H01L 24/17 |
| 2021/0111153 A1 * | 4/2021 | Lin ...................... H01L 23/5384 |

* cited by examiner

*Primary Examiner* — Tremesha S Willis
(74) *Attorney, Agent, or Firm* — Amin, Turocy & Watson, LLP

(57) ABSTRACT

An intermediate substrate is provided with a plurality of conductive posts and support members arranged at opposite sides of a coreless circuit structure and insulating layers encapsulating the conductive posts and the support members. Through the arrangement of the support members and the insulating layers, the intermediate substrate can meet the rigidity requirement so as to effectively resist warping and achieve an application of fine-pitch circuits.

21 Claims, 17 Drawing Sheets

INTERMEDIATE SUBSTRATE AND FABRICATION METHOD THEREOF

CROSS-REFERENCE TO RELATED APPLICATIONS

This application claims priority to Taiwan Application Serial No. 110107729 filed on Mar. 4, 2021. The entirety of the above-mentioned patent application is hereby incorporated by reference herein and made a part of this specification.

BACKGROUND

1. Technical Field

The present disclosure relates to carriers of semiconductor packages, and more particularly, to an intermediate substrate and a fabrication method thereof for improving the reliability.

2. Description of Related Art

In recent years, along with the development of industrial applications, integrated circuit (IC) electronic elements applied to such as telecom servers, high-speed computations, artificial intelligences need more diversified functions and higher performances. Therefore, a plurality of heterogeneous chips need to be integrally packaged and large-size packages tend to have high number of stack layers, high density, high input/output (I/O) count and high pin number.

Currently, the size of high-end semiconductor element packages is becoming larger and larger. For example, the size of a CoWoS (chip on wafer on substrate) type package is up to 54×54 mm$^2$, or even greater than 100×100 mm$^2$, which is much greater than the size of a conventional package (less than 31×31 mm$^2$). Further, the pitch such as flip-chip bump pitch and ball grid array (BGA) pitch of a carrier is continuously reduced. As such, packaging substrates used for flip-chip packages and printed circuit boards (PCBs) used for system assembly tend to have fine line pitches, high number of stack layers and high density. For example, large-size package structures generally have tens of thousands of contacts (I/O) with high density and flip-chip bump pitch. When the flip-chip bump pitch is reduced from 150 μm to 130 μm or even 100 μm, the number of the wiring layers of the carrier will be increased from such as conventional 8 (or 10) layers to 12, 14, 16 or 22 layers.

FIG. 1 is a schematic cross-sectional view of a conventional large-size CoWoS type electronic package 1. Referring to FIG. 1, a through silicon interposer (TSI) 1b is disposed on a flip-chip side of a flip-chip packaging substrate 1a, and at least a semiconductor chip 12 and/or at least a chipset 12' is disposed on the TSI 1b. One side of the TSI 1b has a plurality of conductive bumps 13 serving as connection points for flip-chip packaging. A plurality of bonding pads 101 on the flip-chip side of the flip-chip packaging substrate 1a are flip-chip bonded to the conductive bumps 13 of the TSI 1b through a plurality of pre-solders 102 so as to form flip-chip contacts 13'.

Thereafter, the bottom side of the flip-chip packaging substrate 1a (i.e., ball mounting side) of the electronic package 1 is mounted onto a circuit board 1' through a plurality of solder balls 14.

Currently, the structure of the flip-chip packaging substrate 1a in the industry can be divided into a substrate having a core layer and a coreless substrate. For a substrate having a core layer, a plurality of conductive through holes are formed in the core layer by mechanical drilling and copper electroplating so as to electrically connect upper and lower build-up circuits. As such, the conductive through holes have a large pitch therebetween, thus adversely affecting fine-pitch and fine-line wiring in the core layer. On the other hand, the coreless substrate uses a thin dielectric layer as a build-up layer and conductive blind vias or conductive posts are formed by laser for electrically connecting different layers, thereby facilitating fine-pitch and fine-line wiring. Compared with the substrate with a core layer, the coreless substrate is applicable to fine-pitch and high-density packages. However, the coreless substrate is thin, has poor rigidity and cannot resist warping. Therefore, the coreless substrate is not applicable to the large-size electronic package 1.

Therefore, because the substrate having a core layer has good structural strength and rigidity and is capable of resisting warping, it is used as a flip-chip packaging substrate 1a of the large-size electronic package 1. To fabricate the substrate having a core layer, a base material composed of glass fiber combined with epoxy resin, such as BT (bismaleimide triazine) or FR5, is used as the core layer 10, and then conductive through holes 100 are formed in the core layer 10 by performing such as mechanical drilling, laser drilling or two tapered blind via forming steps and forming a conductive layer in the holes by electroplating or filling a filling material 100' in the holes, and finally a build-up process is performed on two sides of the core layer.

However, the conventional flip-chip packaging substrate 1a having the core layer 10 applied to packages with high integration and large panel size has some drawbacks. For example, since the core layer 10 is made of a base material composed of glass fiber combined with epoxy resin, due to different CTEs (coefficients of thermal expansion) between various layers of the flip-chip packaging substrate 1a and the TSI 1b, the semiconductor chip 12, the chipset 12' and the encapsulant 1c (encapsulating the TSI 1b, the semiconductor chip 12 and the chipset 12'), warping may occur during the packaging process and thus lead to a poor bonding between the packaging substrate 1a and the TSI 1b, or a poor connection may occur between the packaging substrate 1a and the circuit board 1' during the soldering process. More seriously, in a reliability verification, probably due to stresses, delamination may occur between the semiconductor chip 12 and/or the chipset 12' and the carrier, or the semiconductor chip 12 and/or the chipset 12' may crack, or interlayer delamination of the carrier may cause electrical failure of the semiconductor chip 12 and/or the chipset 12'.

Further, when the conventional substrate having the core layer is used as a flip-chip packaging substrate 1a with a large panel size, its rigidity and support stresses are insufficient, thus resulting in poor flatness. Therefore, when it is mounted on the circuit board 1', stresses may adversely affect the stability of product quality and reliability.

Therefore, the thickness h of the core layer 10 is usually increased, for example, from 0.8 mm to 1.2 mm (or 1.6 mm) or more so as to increase the rigidity of the flip-chip packaging substrate 1a and avoid warping. However, such a packaging substrate has the following drawbacks.

First, the pitch between the conductive through holes 100 cannot be reduced. For instance, due to the increased thickness of the core layer 10, the size of end surfaces of the conductive through holes 100 will be increased. For example, if the thickness h is 0.8 mm, the diameter w of the through holes and the pitch between the through holes are typically 150 μm and 300 μm (or more), respectively. If the thickness h is 1.2 mm, the diameter w will be increased to 200 μm or more (that is, the diameter w becomes larger), resulting in a larger pitch between the conductive through holes 100. Therefore, the number of the conductive through holes 100 per unit area is reduced, which adversely affects the fabrication of high-density and fine-pitch wiring. As such, in order to meet the demand for more contacts (I/O), the size of the flip-chip packaging substrate 1a must be increased, thus making it more difficult to control warping and greatly increasing the cost.

Second, the processing cost and difficulty of the conductive through holes 100 increase with the thickness of the core layer 10. For instance, the increased thickness of the core layer 10 results in deeper conductive through holes 100, thereby increasing the difficulty in performing electroplating and smoothly filling the filling material 100' in the deeper conductive through holes 100 and also increasing the processing cost.

On the other hand, as the conventional large-size electronic package 1 is developed toward high number of stack layers and high density, the fabrication processes of the flip-chip packaging substrate 1a and the circuit board 1' become more and more complicated, and the higher the requirement of precision, the more difficult it is to process the circuit board 1'. Therefore, the fabrication process of the circuit board 1' in a large-size package will face the problems of low yield and high cost. Even the system assembly structure of the package with such a large panel size will have serious warping, thereby adversely affecting the quality and reliability of end products.

For example, when the pitch t between the solder balls 14 of the packaging substrate 1a is reduced from 1.0 mm to 0.8-0.7 mm, or even 0.6-0.4 mm, the number of the wiring layers of the circuit board 1' needs to be greatly increased (e.g., from 16 layers to 22 layers, or even more than 30 layers) so as to meet the demand for more contacts. At the same time, the line width/spacing (L/S) of the wiring of the circuit board 1' also needs to be reduced (e.g., from 75/75 μm of currently mass produced PCBs to 25/25 μm). As such, since the general panel size of the circuit board 1' is quite large (e.g., a rectangular panel with a side length of 10 to 30 inches), if the number of the wiring layers of the circuit board 1' is increased to 22 layers (or even more than 30 layers), instead of only arranging fine-line and high-density wiring in an element region A of the large-size electronic package 1, the full panel of the circuit board 1' needs a fine-line process. Therefore, the fine-line process performed on the full panel and the increased number of the wiring layers impose a difficulty in processing the conventional circuit board 1', resulting in an extremely low yield and a substantial increase in cost.

In addition, according to Taiwan Patent No. I308385, the substrate has a thin core layer (e.g., reference number 230) and a reinforcing plate (e.g., reference number 240) so as to facilitate high-density wiring and resist warping. But it has the following drawbacks.

First, since the substrate still has the core layer, the conductive through holes are required, thus limiting the wiring density of the substrate.

Second, since the reinforcing plate is formed at a single side of the overall structure, the substrate is not symmetrical, thereby hindering its application in large-size packages.

Third, although the thickness of the reinforcing plate can be increased to resist warping, such a method results in a longer conductive path (e.g., reference number 252), thereby increasing its processing difficulty. Further, the pitch is not easy to be minimized More seriously, the problem of reliability may occur. For example, due to the deep and long conductive channel (e.g., reference number 250), a large amount of solder is required when an electronic element such as a chip is mounted to the substrate. Consequently, reliability problems such as voids and poor bonding may occur.

Fourth, the reinforcing plate is first coated with an insulating material. Due to the high-density holes (e.g., reference number 246), the coating may be uneven or poor, causing a concern about occurrence of a short circuit.

Therefore, how to overcome the above-described drawbacks of the prior art has become an urgent issue in the art.

SUMMARY

In view of the above-described drawbacks of the prior art, the present disclosure provides an intermediate substrate, which comprises: a coreless circuit structure having opposite first and second surfaces, wherein both the first and second surfaces have circuit layers exposed therefrom; a plurality of first conductive posts having opposite first and second end surfaces, wherein the first conductive posts are bonded and electrically connected to the circuit layer exposed from the first surface of the coreless circuit structure via the first end surfaces of the first conductive posts; a first support member being a plate body having a plurality of mesh-shaped openings and having opposite first and second sides, wherein the first support member is disposed on the first surface of the coreless circuit structure via the first side of the first support member, and the plurality of first conductive posts are positioned in at least one of the mesh-shaped openings of the first support member; a first insulating layer formed on the first surface of the coreless circuit structure for encapsulating the plurality of first conductive posts and the first support member, wherein the second end surfaces of the plurality of first conductive posts are exposed from the first insulating layer; a plurality of second conductive posts having opposite first and second end surfaces, wherein the plurality of second conductive posts are bonded and electrically connected to the circuit layer exposed from the second surface of the coreless circuit structure via the first end surfaces of the second conductive posts; a second support member being a plate body having a plurality of mesh-shaped openings and having opposite first and second sides, wherein the second support member is disposed on the second surface of the coreless circuit structure via the first side of the second support member, and the plurality of second conductive posts are positioned in at least one of the mesh-shaped openings of the second support member; and a second insulating layer formed on the second surface of the coreless circuit structure for encapsulating the plurality of second conductive posts and the second support member, wherein the second end surfaces of the plurality of second conductive posts are exposed from the second insulating layer.

In the intermediate substrate, the first conductive posts and/or the second conductive posts comprise a plurality of layers of post bodies stacked on one another.

In the intermediate substrate, the first insulating layer is disposed between the first side of the first support member and the circuit layer of the first surface of the coreless circuit structure, or the first side of the first support member is directly bonded to the circuit layer of the first surface of the coreless circuit structure.

In the intermediate substrate, an adhesive material is disposed between the first side of the second support member and the circuit layer of the first surface of the coreless circuit structure, or the first side of the second support member is directly bonded to the circuit layer of the second surface of the coreless circuit structure.

In the intermediate substrate, the second side of the first support member is exposed from the first insulating layer, and/or the second side of the second support member is exposed from the second insulating layer. Further, a heat dissipating element is disposed on the exposed surface of the first support member or the exposed surface of the second support member.

In the intermediate substrate, the first side of the first support member is bonded to the circuit layer exposed from the first surface of the coreless circuit structure, and/or the first side of the second support member is bonded to the circuit layer exposed from the second surface of the coreless circuit structure.

In the intermediate substrate, the first support member and/or the second support member comprises a plurality of layers of plate bodies stacked on one another and each having a plurality of mesh-shaped openings.

In the intermediate substrate, the plurality of first conductive posts are positioned in the mesh-shaped openings of the first support member, respectively, and/or the plurality of second conductive posts are positioned in the mesh-shaped openings of the second support member, respectively.

In the intermediate substrate, the plurality of first conductive posts and the first support member are made of copper or copper alloy.

In the intermediate substrate, the plurality of second conductive posts and the second support member are made of copper, copper alloy, stainless steel, or iron-nickel alloy.

In the intermediate substrate, the first support member and/or the second support member are made of metal, organic resin, plastic steel, or ceramic insulating material.

In the intermediate substrate, the second end surfaces of the plurality of first conductive posts serve as a chip mounting side for bonding with a chip or an interposer in a flip-chip manner, and the second end surfaces of the plurality of second conductive posts serve as a circuit board mounting side for bonding with a circuit board.

The present disclosure further provides a method for fabricating an intermediate substrate, which comprises: providing a carrier; forming a plurality of first conductive posts on the carrier by patterned electroplating; forming a plate body-shaped first support member having a plurality of mesh-shaped openings to cause the plurality of first conductive posts to be positioned in at least one of the mesh-shaped openings of the first support member; forming a first insulating layer on the carrier for encapsulating the plurality of first conductive posts and the first support member; leveling the first insulating layer, wherein one end surfaces of the plurality of first conductive posts are exposed from a surface of the first insulating layer; forming a coreless circuit structure having at least one circuit layer on the first insulating layer, the plurality of first conductive posts and the first support member by a build-up process (semi-additive process) to bond the circuit layer of the coreless circuit structure to one end surface of the plurality of first conductive posts; forming a plurality of second conductive posts on the coreless circuit structure by patterned electroplating; forming a plate body-shaped second support member having a plurality of mesh-shaped openings to cause the plurality of second conductive posts to be positioned in at least one of the mesh-shaped openings of the second support member and bond one end surfaces of the plurality of second conductive posts to the circuit layer of the coreless circuit structure; forming a second insulating layer on the coreless circuit structure for encapsulating the plurality of second conductive posts and the second support member; leveling the second insulating layer, wherein the other end surfaces of the plurality of second conductive posts are exposed from a surface of the second insulating layer; and removing the carrier to expose the other end surfaces of the plurality of first conductive posts from the first insulating layer.

In the method for fabricating the intermediate substrate, one side of the first support member is exposed from the first insulating layer, and/or one side of the second support member is exposed from the second insulating layer. Further, a heat dissipating element is formed on the exposed surface of the first support member or the exposed surface of the second support member.

In the method for fabricating the intermediate substrate, the first support member and the plurality of first conductive posts are simultaneously formed on the carrier by patterned electroplating, and the first conductive posts comprise a single layer of post body or a plurality of layers of post bodies stacked on one another, and/or the first support member comprises a single layer of plate body having a plurality of mesh-shaped openings or a plurality of layers of plate bodies stacked on one another and having a plurality of mesh-shaped openings.

In the method for fabricating the intermediate substrate, the plurality of first conductive posts are formed on the carrier by patterned electroplating first and then the first support member having the plurality of mesh-shaped openings is bonded onto the carrier via an adhesive material, wherein the first conductive posts comprise a single layer of post body or a plurality of layers of post bodies stacked on one another, and/or the first support member comprises a single layer of plate body having a plurality of mesh-shaped openings or a plurality of layers of plate bodies stacked on one another and having a plurality of mesh-shaped openings; or the first support member having the plurality of mesh-shaped openings is bonded onto the carrier via an adhesive material first and then the plurality of first conductive posts are formed on the carrier by patterned electroplating, wherein the first conductive posts comprise a single layer of post body or a plurality of layers of post bodies stacked on one another, and/or the first support member comprises a single layer of plate body having a plurality of mesh-shaped openings or a plurality of layers of plate bodies stacked on one another and having a plurality of mesh-shaped openings.

In the method for fabricating the intermediate substrate, if the first conductive posts and the second conductive posts are directly formed by electroplating, better reliability can be obtained than the conventional (e.g., TWI308385) laser conductive blind vias.

In the method for fabricating the intermediate substrate, the second support member and the plurality of second conductive posts are simultaneously formed on the circuit layer of one surface of the coreless circuit structure by patterned electroplating, and the second conductive posts comprise a single layer of post body or a plurality of layers of post bodies stacked on one another, and/or the second support member comprises a single layer of plate body having a plurality of mesh-shaped openings or a plurality of layers of plate bodies stacked on one another and having a plurality of mesh-shaped openings.

In the method for fabricating the intermediate substrate, the plurality of second conductive posts are formed on the circuit layer of one surface of the coreless circuit structure by patterned electroplating first and then the second support member having the plurality of mesh-shaped openings is bonded onto the circuit layer of one surface of the coreless circuit structure via an adhesive material, wherein the second conductive posts comprise a single layer of post body or a plurality of layers of post bodies stacked on one another, and/or the second support member comprises a single layer of plate body having a plurality of mesh-shaped openings or a plurality of layers of plate bodies stacked on one another and having a plurality of mesh-shaped openings; or the second support member having the plurality of mesh-shaped openings is bonded onto the circuit layer of one surface of the coreless circuit structure via an adhesive material first and then the plurality of second conductive posts are formed on the circuit layer of one surface of the coreless circuit structure by patterned electroplating, wherein the second conductive posts comprise a single layer of post body or a plurality of layers of post bodies stacked on one another, and/or the second support member comprises a single layer of plate body having a plurality of mesh-shaped openings or a plurality of layers of plate bodies stacked on one another and having a plurality of mesh-shaped openings.

In the method for fabricating the intermediate substrate, the plurality of first conductive posts are positioned in the mesh-shaped openings of the first support member, respectively, and/or the plurality of second conductive posts are positioned in the mesh-shaped openings of the second support member, respectively.

The present disclosure further provides another method for fabricating an intermediate substrate, which comprises: providing a carrier, wherein the carrier is a plate body made of copper, copper alloy, stainless steel or iron-nickel alloy; forming a coreless circuit structure having a plurality of circuit layers on the carrier via a build-up process (semi-additive process), wherein at least one of the circuit layers of the coreless circuit structure is bonded onto the carrier; forming a plurality of first conductive posts on one of the circuit layers of the coreless circuit structure by patterned electroplating; forming a plate body-shaped first support member having a plurality of mesh-shaped openings to cause the plurality of first conductive posts to be positioned in at least one of the mesh-shaped openings of the first support member; forming a first insulating layer on the coreless circuit structure for encapsulating the plurality of first conductive posts and the first support member; leveling the first insulating layer, wherein one end surfaces of the plurality of first conductive posts are exposed from a surface of the first insulating layer; patterned etching the carrier to form a plurality of second conductive posts and a second support member, wherein the second support member is a plate body having a plurality of mesh-shaped openings and the plurality of second conductive posts are positioned in at least one of the mesh-shaped openings of the second support member; forming a second insulating layer on the coreless circuit structure for encapsulating the plurality of second conductive posts and the second support member; and leveling the second insulating layer, wherein one end surfaces of the plurality of second conductive posts are exposed from a surface of the second insulating layer.

In the method for fabricating the intermediate substrate, one side of the first support member is exposed from the first insulating layer, and/or one side of the second support member is exposed from the second insulating layer.

In the method for fabricating the intermediate substrate, the first support member and the plurality of first conductive posts are simultaneously formed on the circuit layers of the coreless circuit structure by patterned electroplating, and the first conductive posts comprise a single layer of post body or a plurality of layers of post bodies stacked on one another, and/or the second support member comprises a single layer of plate body or a plurality of layers of plate bodies stacked on one another.

In the method for fabricating the intermediate substrate, the plurality of first conductive posts are formed on one of the circuit layers of the coreless circuit structure by patterned electroplating first and then the first support member is bonded onto one of the circuit layers of the coreless circuit structure via an adhesive material, wherein the first conductive posts comprise a single layer of post body or a plurality of layers of post bodies stacked on one another, and the first support member comprises a single layer of plate body or a plurality of layers of plate bodies stacked on one another; or the first support member is bonded onto one of the circuit layers of the coreless circuit structure via an adhesive material first and then the plurality of first conductive posts are formed on one of the circuit layers of the coreless circuit structure by patterned electroplating, wherein the first conductive posts comprise a single layer of post body or a plurality of layers of post bodies stacked on one another, and the first support member comprises a single layer of plate body or a plurality of layers of plate bodies stacked on one another.

In the method for fabricating the intermediate substrate, the plurality of first conductive posts are positioned in the mesh-shaped openings of the first support member, respectively, and/or the plurality of second conductive posts are positioned in the mesh-shaped openings of the second support member, respectively.

According to the present disclosure, in the method for fabricating the intermediate substrate, if the first conductive posts and the second conductive posts are formed by direct electroplating, the first conductive posts and the second conductive posts of the present disclosure have a better reliability than the conventional laser-formed blind vias.

Moreover, according to the present disclosure, interlayer conductive wiring with fine-pitch (e.g., 60-100 μm, much better than a through hole pitch of 300 μm in a conventional substrate having a core layer) and fine-line can be easily fabricated through the coreless circuit structure so as to meet high I/O count and high wiring density requirements of large-size packages.

Further, by disposing the first and second support members on two opposite sides of the coreless circuit structure, a sandwich structure is obtained. As such, through the arrangement of the first and second support members with good rigidity and suitable thickness and the first and second insulating layers, the intermediate substrate can meet the rigidity requirement so as to effectively resist warping and improve the quality, reliability and yield when a chip packaging process is performed on the intermediate substrate.

Furthermore, by using the coreless circuit structure, the present disclosure dispenses with a conductive through hole process as required in the prior art so as to overcome the conventional drawbacks of a core layer.

In addition, the present disclosure allows regions requiring fine-line wiring for a circuit board to be collectively designed in the coreless circuit structure and increases the pitch between the second conductive posts, thus dispensing with a high-density fine-line process on the circuit board and overcoming the conventional drawbacks of a circuit board.

BRIEF DESCRIPTION OF THE DRAWINGS

FIGS. 2A-1 to 2F-1 are schematic cross-sectional views illustrating a method for fabricating an intermediate substrate according to a first embodiment of the present disclosure.

FIG. 2A-2 is a schematic partially perspective view of FIG. 2A-1.

FIG. 2A-3 shows another aspect of FIG. 2A-1.

FIG. 2B-2 shows another aspect of FIG. 2B-1.

FIG. 2C-2 shows another aspect of FIG. 2C-1.

FIG. 2D-2 shows another aspect of FIG. 2D-1.

FIGS. 2E-2, 2E-3 and 2E-4 are schematic cross-sectional views showing various aspects of FIG. 2E-1.

FIGS. 2F-2, 2F-3 and 2F-4 are schematic cross-sectional views showing various aspects of FIG. 2F-1.

FIG. 2F-5 is a schematic partially perspective view of FIG. 2F-4.

FIGS. 2G-1, 2G-2 and 2G-3 are schematic cross-sectional views showing application of the intermediate substrate according to various embodiments of the present disclosure.

FIGS. 3A to 3E-1 are schematic cross-sectional views illustrating a method for fabricating an intermediate substrate according to a second embodiment of the present disclosure.

FIG. 3B-2 shows another aspect of FIG. 3B-1.

FIG. 3C-2 shows another aspect of FIG. 3C-1.

FIGS. 3D-2 and 3D-3 show various aspects of FIG. 3D-1.

FIGS. 3E-2, 3E-3 and 3E-4 are schematic cross-sectional views showing various aspects of FIG. 3E-1.

FIGS. 4A to 4D-1 are schematic cross-sectional views illustrating a method for fabricating an intermediate substrate according to a third embodiment of the present disclosure.

FIG. 4B-2 shows another aspect of FIG. 4B-1.

FIG. 4C is a schematic cross-sectional view illustrating one of steps of a method for fabricating an intermediate substrate.

FIG. 4D-2 shows another aspect of FIG. 4D-1.

FIGS. 5A-1 to 5D-1 are schematic cross-sectional views illustrating a method for fabricating an intermediate substrate according to a fourth embodiment of the present disclosure.

FIG. 5A-2 is a schematic partially perspective view of FIG. 5A-1.

FIGS. 5D-2, 5D-3 and 5D-4 are schematic cross-sectional views showing various aspects of FIG. 5D-1.

DETAILED DESCRIPTION OF EMBODIMENTS

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "third," "fourth," "on," "a," etc., are merely for illustrative purposes and should not be construed to limit the scope of the present disclosure.

Figure 1:
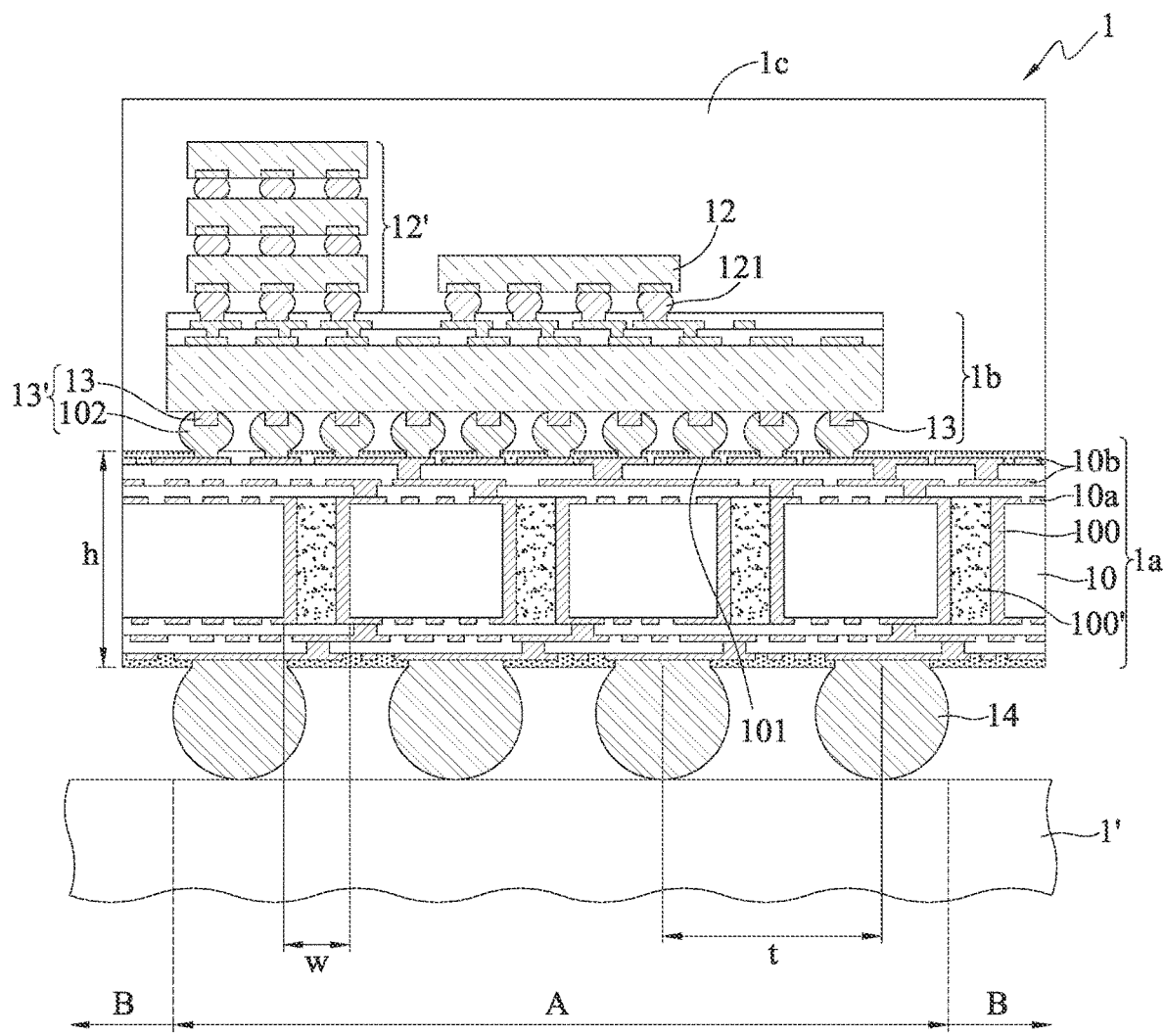
FIG. 1 is a schematic cross-sectional view of a conventional large-size CoWoS type electronic package.
Figures 1, 2A:
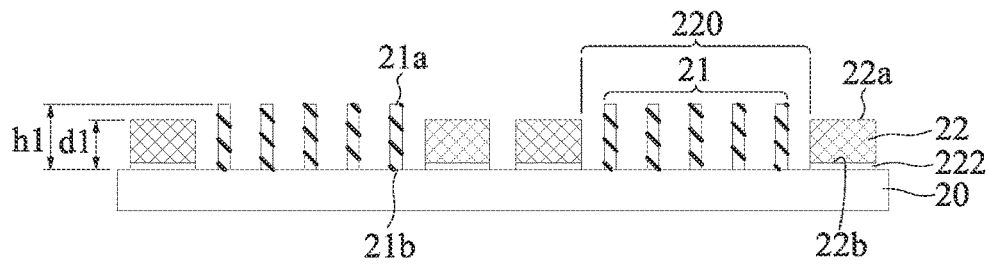
Figures 2, 2A:
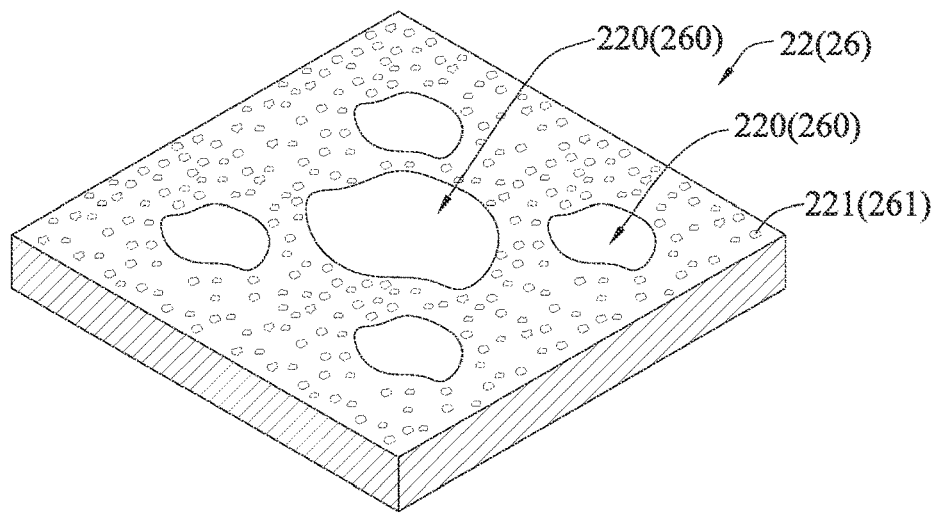
Figures 2, 2A, 3:
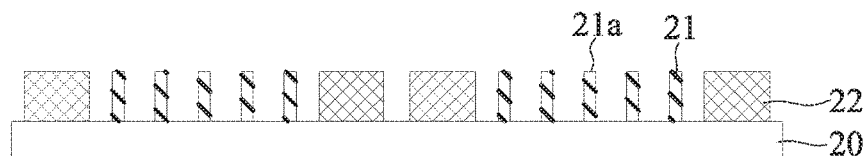
Figures 1, 2B:
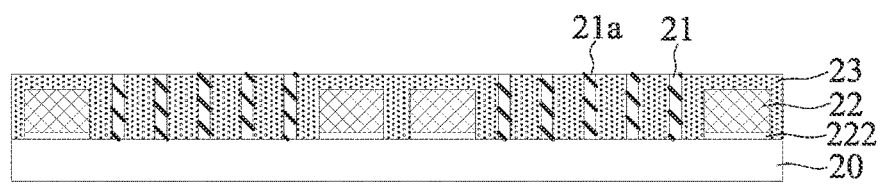
Figures 2, 2B:
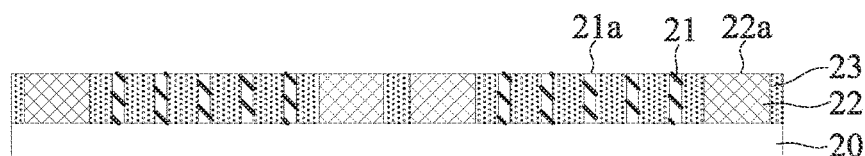
Figures 1, 2C:
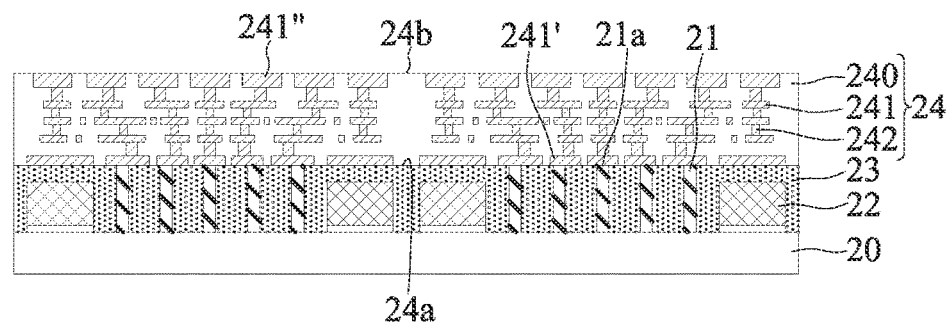
Figures 2, 2C:
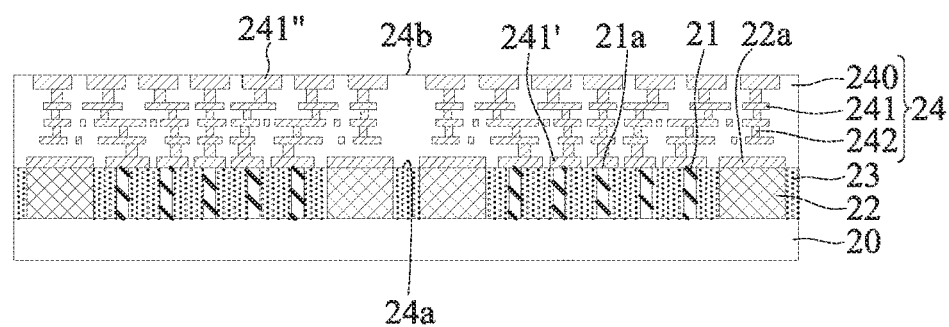
Figures 1, 2D:
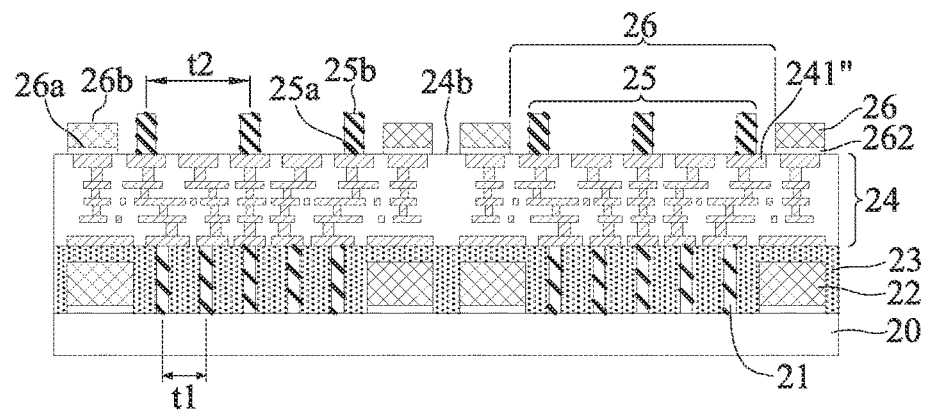
Figures 2, 2D:
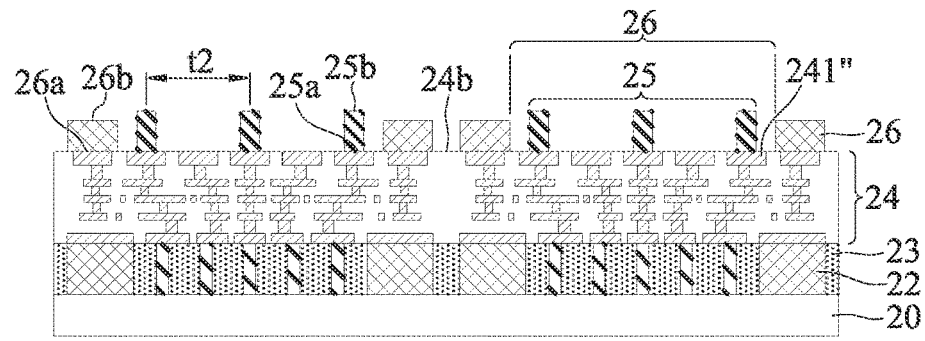
Figures 1, 2E:
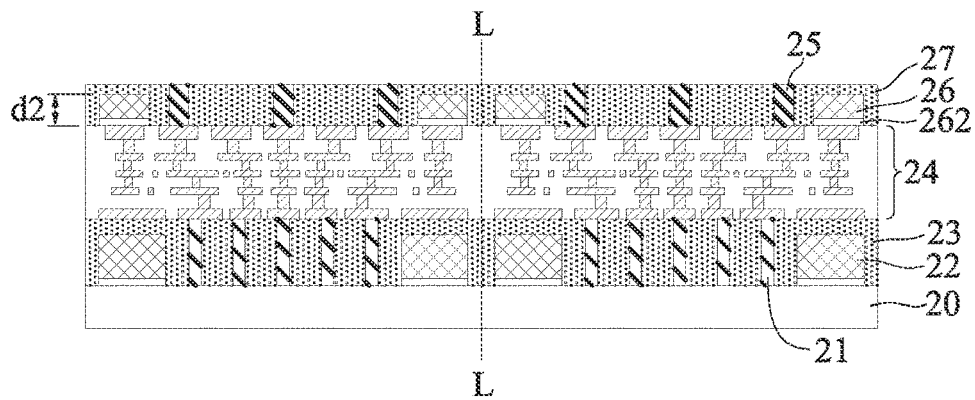
Figures 2, 2E:
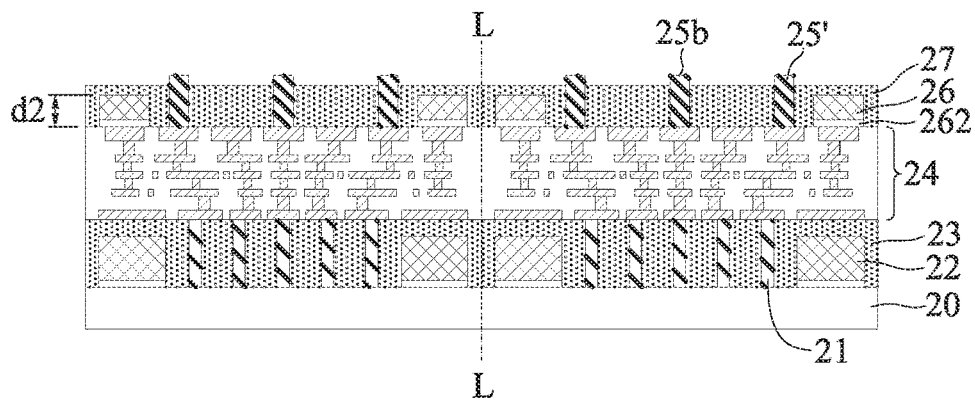
Figures 2, 2E, 3:
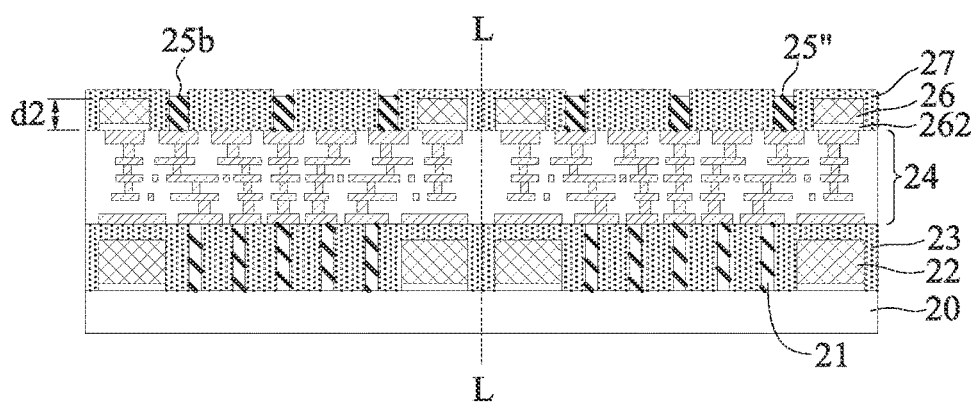
Figures 2, 2E, 3, 4:
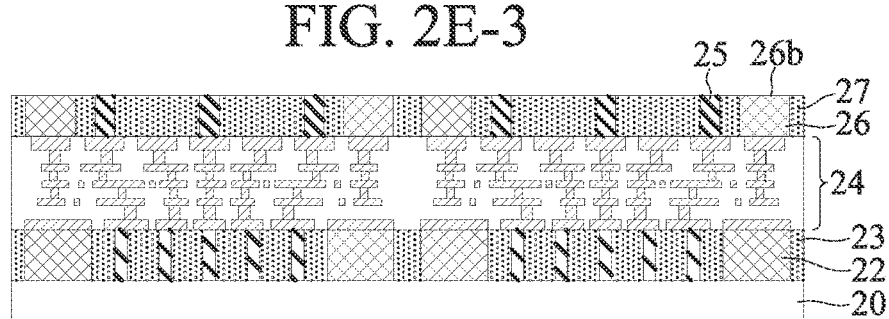
Figures 1, 2F:
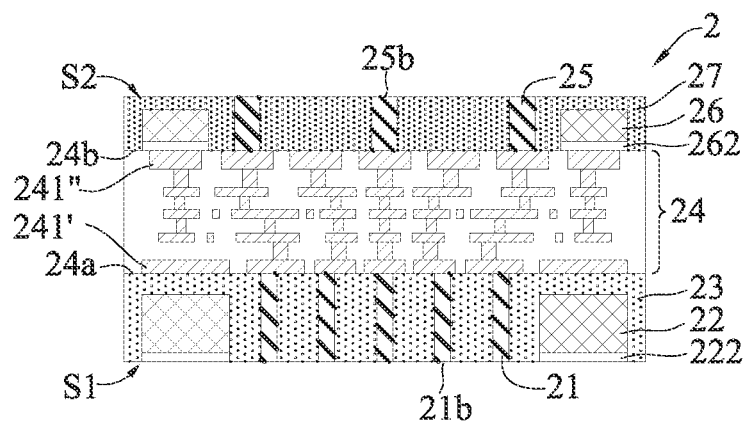
Figures 2, 2F:
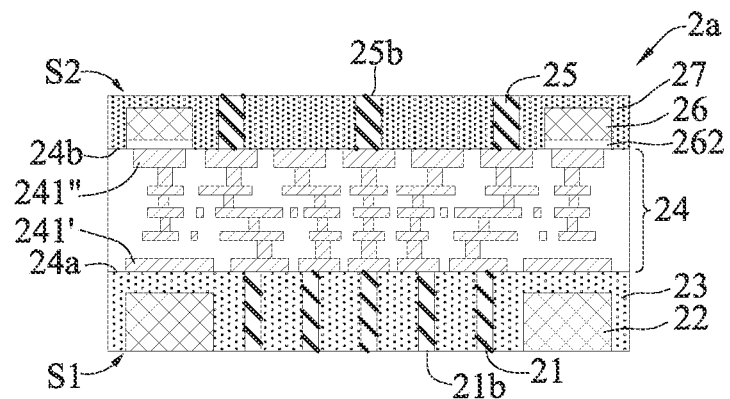
Figures 2, 2F, 3:
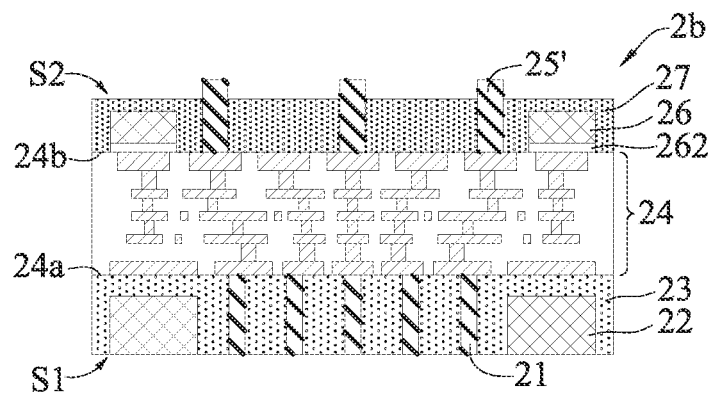
Figures 2, 2F, 3, 4:
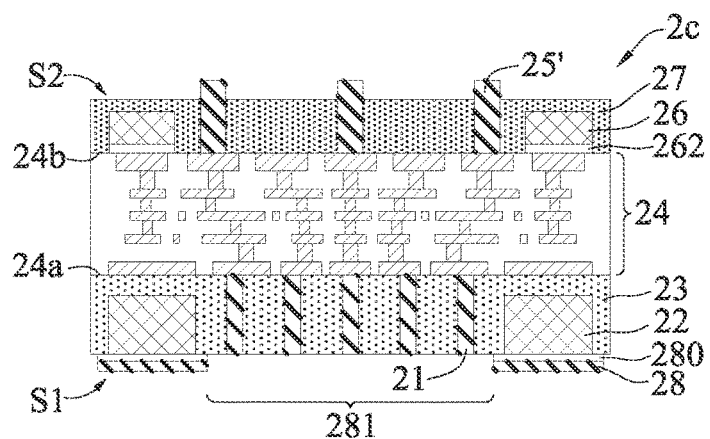
Figures 2, 2F, 3, 4, 5:
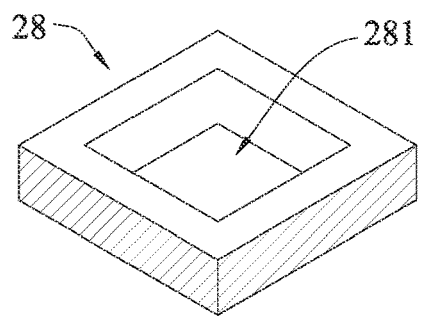
Figures 1, 2G:
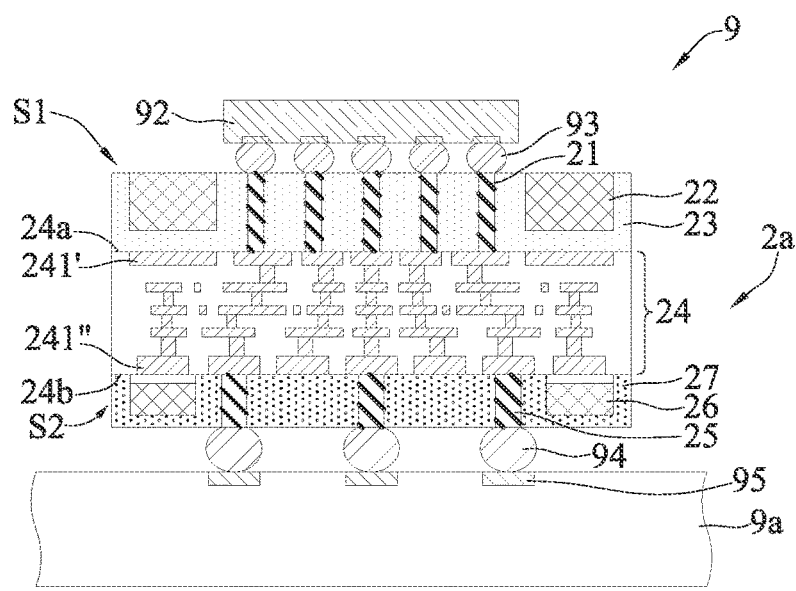
Figures 2, 2G:
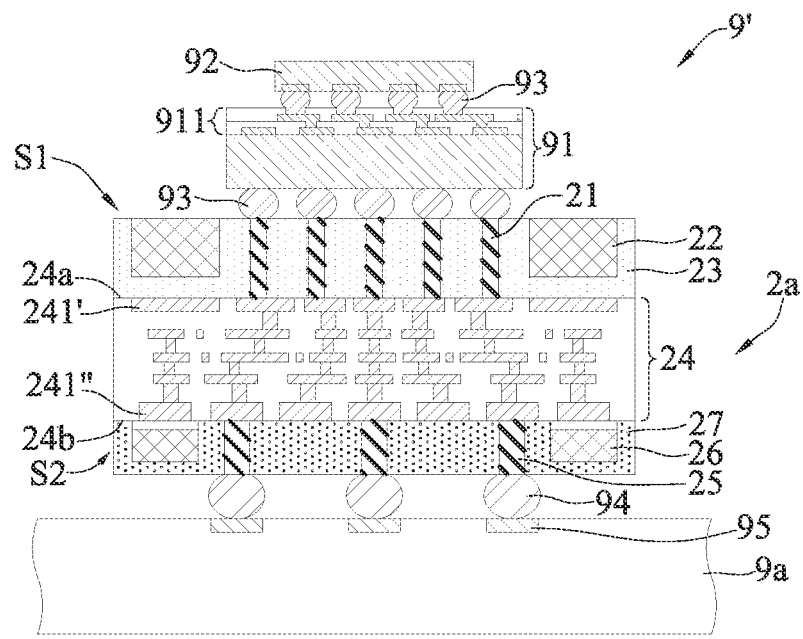
Figures 2, 2G, 3:
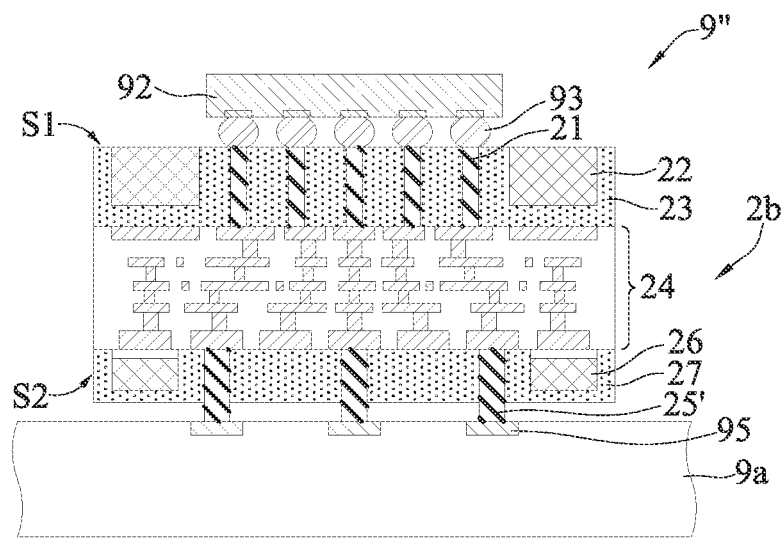

FIGS. 2A-1 to 2G-1 are schematic cross-sectional views illustrating a method for fabricating an intermediate substrate 2 used for flip-chip packages according to a first embodiment of the present disclosure.

Referring to FIG. 2A-1, a plurality of first conductive posts 21 and at least a first support member 22 serving as a rigid layer are formed on a carrier 20.

In an embodiment, the first conductive posts 21 has a single layer of post body. For example, the first conductive posts 21 are metal posts made of copper, copper alloy, etc. The first support member 22 has a single layer of plate body (as shown in FIG. 2A-2) made of a conductive base material, a semiconductor base material or an insulating base material and having a plurality of mesh-shaped openings (large-sized openings 220 and small-sized openings 221). The plurality of first conductive posts 21 are positioned in at least one of the mesh-shaped openings (e.g., openings 220) of the first support member 22 for bonding with a TSI, a semiconductor wafer, passive element and so on. For example, the first conductive posts 21 grow from a surface of the carrier 20 by electroplating, deposition or the like after lithography patterning, and the first support member 22 is made of an insulating base material such as rigid ceramic, organic resin and so on, and fastened onto the carrier 20 through a bonding layer 222 made of such as adhesive material by attaching or thermal compression bonding (or vacuum compression bonding). Specifically, the first support member 22 made of the conductive base material can be a metal conductor of stainless steel or containing iron (Fe), nickel (Ni), copper (Cu), aluminum (Al), magnesium (Mg), zinc (Zn) or alloy thereof. The first support member 22 made of organic resin can use a base material containing glass fiber and organic resin, such as BT (bismaleimide triazine), FR4 or FR5, or use a high-rigidity organic base material without glass fiber but containing filler (e.g., $SiO_2$), or an epoxy resin material containing a high proportion of filler, such as epoxy molding compound (EMC), or high strength plastics such as plastic steel.

Further, the first conductive posts 21 have opposite first and second end surfaces 21a, 21b, and the first support member 22 has opposite first and second sides 22a, 22b. The first conductive posts 21 are bonded onto the carrier 20 via the second end surfaces 21b thereof, and the first support member 22 is bonded onto the carrier 20 via the second side 22b thereof. For example, the plurality of first conductive posts 21 can be formed on the carrier 20 by patterned electroplating first and then the first support member 22 having a plurality of mesh-shaped openings (e.g., openings 220, 221) is attached to the carrier 20 through an adhesive material. Alternatively, the first support member 22 having a plurality of mesh-shaped openings (e.g., openings 220, 221) is attached onto the carrier 20 through an insulating adhesive material first and then the first conductive posts 21 are formed on the carrier 20 by patterned electroplating. It should understood that the plurality of first conductive posts 21 are positioned in at least one of the mesh-shaped openings (e.g., openings 220, 221).

Alternatively, referring to FIG. 2A-3, the plurality of first conductive posts 21 and the first support member 22 can be simultaneously formed on the carrier 20 by patterned electroplating. Therein, the plurality of first conductive posts 21 have a single layer of post body, and the first support member 22 has a plate body with a plurality of mesh-shaped openings (e.g., openings 220, 221). It should be understood that the plurality of first conductive posts 21 are positioned in at least one of the mesh-shaped openings (e.g., openings 220, 221).

Further, in the pre-fabrication process of the first support member 22, if a metal plate such as stainless steel, copper alloy, aluminum alloy, iron nickel alloy, etc. is used, the mesh-shaped openings are formed by laying photoresist, performing exposure and development and then performing chemical etching to form regular or irregular mesh-shaped openings of same or different sizes. On the other hand, if an organic resin plate, a plastic steel plate or a ceramic insulating plate is used, the regular or irregular mesh-shaped openings of same or different sizes are preferably formed by laser, mechanical drilling, mechanical forming (NC router), plasma etching or chemical etching.

Furthermore, the thickness d1 of the first support member 22 (the bonding layer 222 is extremely thin and negligible) can be designed according to needs, and the height h1 of the first conductive posts 21 is slightly higher than or equal to the thickness d1 of the first support member 22.

Referring to FIG. 2B-1, a first insulating layer 23 is formed on the carrier 20 to encapsulate the plurality of first conductive posts 21 and the first support member 22, and also filled in the openings 220, 221 of the first support member 22. As such, the plurality of first conductive posts 21 and the first support member 22 are embedded in the first insulating layer 23. Then, a leveling process is performed on the first insulating layer 23 so as to expose the first end surfaces 21a of the first conductive posts 21 from a surface of the first insulating layer 23. Therefore, by filling the first insulating layer 23 in the openings 220, 221 of the first support member 22, the bonding force of the first insulating layer 23 with the first conductive posts 21 and the first support member 22 is increased.

In an embodiment, the first insulating layer 23 is made of an organic photosensitive dielectric material or an organic non-photosensitive dielectric material (e.g., epoxy resin). For example, the organic dielectric material can be solder mask, Ajinomoto build-up film (ABF), prepreg (PP), molding compound, EMC containing a filler, a primer, etc.

Further, the leveling process includes grinding, chemical etching, laser ablation, sand blasting or plasma etching. Through the leveling process, portions of the first conductive posts 21 and the first insulating layer 23 are removed, the surface of the first insulating layer 23 is flush with the first end surfaces 21a of the first conductive posts 21, and the first end surfaces 21a of the first conductive posts 21 are exposed from the top surface of the first insulating layer 23.

Furthermore, the first support member 22 is embedded in the first insulating layer 23. It should be understood that the first support member 22 can be exposed or not exposed from the top surface of the first insulating layer 23 according to needs. For example, the surface of the first side 22a of the first support member 22 is flush with the surface of the first insulating layer 23 so as to be exposed from the surface of the first insulating layer 23 (as shown in FIG. 2B-2).

Referring to FIG. 2C-1, a coreless circuit structure 24 having at least a circuit layer 241, 241', 241" is formed on the first insulating layer 23, the plurality of first conductive posts 21 and the first support member 22 by a build-up process (semi-additive process [SAP]), and the circuit layer 241' of the coreless circuit structure 24 is bonded onto the first end surfaces 21a of the first conductive posts 21. According to needs, the circuit layer 241' of the coreless circuit structure 24 can further be bonded onto the first side 22a of the first support member 22 (as shown in FIG. 2C-2).

In an embodiment, the coreless circuit structure 24 has a plurality of dielectric layers 240, a plurality of circuit layers 241, 241', 241" formed on the dielectric layers 240, and a plurality of conductive blind vias (or conductive posts) 242 formed in the dielectric layers 240 and electrically connecting the circuit layers 241, 241', 241". Further, the circuit layer 241' is electrically connected to the first conductive posts 21. For example, the circuit layers 241, 241', 241" are formed by using SAP technologies, such as the conventional lithography patterning and electroplating processes, and the dielectric layers 240 are made of a dielectric material such as ABF, a photosensitive dielectric material, polybenzoxazole (PBO), polyimide (PI), BT, FR5, prepreg (PP), a molding compound, an EMC film, etc.

Further, the first insulating layer 23 and the dielectric layers 240 can be made of the same or different materials. For example, the materials of the first insulating layer 23 and the dielectric layers 240 can be adjusted according to a CTE matching requirement (e.g., the materials of the first insulating layer 23 and the dielectric layers 240 can be adjusted to meet a low CTE requirement).

Furthermore, the coreless circuit structure 24 has opposite first and second surfaces 24a, 24b, and the circuit layers 241', 241" are exposed from the first and second surfaces 24a, 24b of the coreless circuit structure 24, respectively. The circuit layer 241' exposed from the first surface 24a of the coreless circuit structure 24 is bonded to the first end surfaces 21a of the first conductive posts 21. Further, according to needs, the circuit layer 241' exposed from the first surface 24a of the coreless circuit structure 24 is bonded to the first side 22a of the first support member 22 (as shown in FIG. 2C-2).

Referring to FIG. 2D-1, a plurality of second conductive posts 25 and a plate body-shaped second support member 26 (having a structure as shown in FIG. 2A-2) having a plurality of mesh-shaped openings (large-sized openings 260 and small-sized openings 261) are formed on the second surface 24b of the coreless circuit structure 24 by patterned electroplating. The plurality of second conductive posts 25 are positioned in at least one of the mesh-shaped openings (e.g., openings 260, 261) of the second support member 26 and electrically connected to the coreless circuit structure 24. The coreless circuit structure 24 can further be electrically connected to the second support member 26 according to needs.

In an embodiment, the second conductive posts 25 have opposite first and second end surfaces 25a, 25b. The second conductive posts 25 are bonded and electrically connected to the circuit layer 241" of the second surface 24b of the coreless circuit structure 24 via the first end surfaces 25a thereof. The second support member 26 has opposite first and second sides 26a, 26b. The second support member 26 is disposed on the second surface 24b of the coreless circuit structure 24 via the first side 26a thereof.

In an embodiment, the second support member 26 can be fastened onto the coreless circuit structure 24 through a bonding layer 262 made of such as adhesive material by attaching or thermal compression bonding (or vacuum compression bonding). For example, the plurality of second conductive posts 25 are formed on the circuit layer 241" exposed from the second surface 24b of the coreless circuit structure 24 (the height of the second conductive posts 25 can be adjusted according to needs) by patterned electroplating first and then the second support member 26 having a plurality of mesh-shaped openings (e.g., openings 260, 261) is attached onto the second surface 24b of the coreless circuit structure 24 through an insulating adhesive material.

Alternatively, the second support member 26 having a plurality of mesh-shaped openings (e.g., openings 260, 261) is attached onto the circuit layer 241" exposed from the second surface 24b of the coreless circuit structure 24 through an insulating adhesive material first and then the plurality of second conductive posts 25 are formed on the circuit layer 241" exposed from the second surface 24b of the coreless circuit structure 24 by patterned electroplating. It should understood that the plurality of second conductive posts 25 are positioned in at least one of the mesh-shaped openings (e.g., openings 260, 261).

In an embodiment, the second conductive posts 25 are made of copper or copper alloy, and the second support member 26 is a plate body made of a conductive base material, a semiconductor base material or an insulating base material and having a plurality of openings 260, 261. For example, the second support member 26 made of the conductive base material can be a metal conductor of copper, copper alloy, stainless steel or containing Fe, Ni, Cu, Al, Mg, Zn or alloy thereof. The second support member 26 made of organic resin can use a base material containing glass fiber and organic resin, such as BT (bismaleimide triazine), FR4 or FR5, or use a high-rigidity organic base material without glass fiber but containing filler (e.g., $SiO_2$). Alternatively, the second support member 26 is made of an insulating base material such as rigid ceramic, organic resin and so on, and the organic resin can be an epoxy resin material containing a high proportion of filler, such as epoxy molding compound (EMC), or high strength plastics such as plastic steel. Further, the pre-fabrication process of the second support member 26 can be the same as that of the first support member 22.

Alternatively, referring to FIG. 2D-2, the plurality of second conductive posts 25 and the second support member 26 can be simultaneously formed on the circuit layer 241" exposed from the second surface 24b of the coreless circuit structure 24 by patterned electroplating. Therein, the plurality of second conductive posts 25 have a single layer of post body, and the second support member 26 has a single layer of plate body with a plurality of mesh-shaped openings (e.g., openings 260, 261). It should be understood that the plurality of second conductive posts 25 are positioned in at least one of the mesh-shaped openings (e.g., openings 260), and both the second conductive posts 25 and the second support member 26 can be made of copper, or copper alloy.

Further, in an embodiment, if the second conductive posts 25 serve as a circuit board side S2 of the intermediate substrate 2 (as shown in FIG. 2F-1) for bonding with a circuit board, the first conductive posts 21 serve as a chip mounting side S1 of the intermediate substrate 2 (as shown in FIG. 2F-1) for bonding with a chip. Therefore, the pitch t1 between the first conductive posts 21 is much less than the pitch t2 between the second conductive posts 25. It should be understood that the chip mounting side of the intermediate substrate 2 can be fabricated before the circuit board side, or the circuit board side of the intermediate substrate 2 can be fabricated before the chip mounting side.

Referring to FIG. 2E-1, a second insulating layer 27 is formed on the coreless circuit structure 24 to encapsulate the plurality of second conductive posts 25 and the second support member 26. As such, the plurality of second conductive posts 25 and the second support member 26 are embedded in the second insulating layer 27. Further, a leveling process is performed on the second insulating layer 27 so as to expose the second end surfaces 25b of the second conductive posts 25 from a surface of the second insulating layer 27.

In an embodiment, the second insulating layer 27 can be made of the same material as the first insulating layer 23. It should be understood that the material of the second insulating layer 27 can be the same as or different from that of the dielectric layers 240. For example, the materials of the second insulating layer 27 and the dielectric layers 240 can be adjusted according to a CTE matching requirement (e.g., the materials of the second insulating layer 27 and the dielectric layers 240 can be adjusted to meet a low CTE requirement).

Further, the leveling process includes grinding, chemical etching, laser ablation, sand blasting, plasma etching and so on. Through the leveling process, portions of the second conductive posts 25 and the second insulating layer 27 are removed, the surface of the second insulating layer 27 is flush with the second end surfaces 25a of the second conductive posts 25, and the second side 26b of the second support member 26 is not exposed from the top surface of the second insulating layer 27. Alternatively, referring to FIG. 2E-2, a portion of the second insulating layer 27 is further removed by etching or laser ablation so as to cause the surface of the second insulating layer 27 to be slightly lower than the second end surfaces 25b of the second conductive posts 25'. Alternatively, referring to FIG. 2E-3, the second conductive posts 25 are further etched, such that the second end surfaces 25b of the second conductive posts 25" are slightly lower than the surface of the second insulating layer 27. As such, the second end surfaces 25b of the second conductive posts 25, 25', 25" are exposed from (flush with, protruded from or recessed into) the top surface of the second insulating layer 27. Further, referring to FIG. 2E-4, the surface of the second side 26b of the second support member 26 can be flush with and exposed from the surface of the second insulating layer 27.

Furthermore, the thickness d2 of the second support member 26 (the bonding layer 262 is extremely thin and negligible) can be designed according to needs. Preferably, the thickness d2 of the second support member 26 is between 0.05 and 1.5 mm.

Referring to FIG. 2F-1, the carrier 20 is removed so as to expose the second end surfaces 21b of the plurality of first conductive posts 21 from a surface of the first insulating layer 23. Finally, a singulation process is performed along a cutting path L of FIG. 2E-1, thereby obtaining the intermediate substrate 2.

In an embodiment, after the carrier 20 is removed, the bonding layer 222 on the first support member 22 can further be removed so as to expose the second side 22b of the first support member 22 from the first insulating layer 23, thus obtaining an intermediate substrate 2a of FIG. 2F-2. For example, the bonding layer 222 can be removed by grinding, chemical etching, laser ablation, sand blasting, plasma etching and so on.

Further, the process of FIG. 2E-2 is continued to obtain an intermediate substrate 2b of FIG. 2F-3. Referring to FIGS. 2F-4 and 2F-5, after the carrier 20 is removed, a heat dissipating element 28 (a frame body having a window 281 exposing the plurality of first conductive posts 21) can further be attached to the chip mounting side S1, i.e., the surface side exposed from the first insulating layer 23 and the second side 22b of the first support member 22, through an adhesive material 280 so as to improve heat dissipation.

According to the fabrication method of the present disclosure, fine-pitch (e.g., 15 to 100 μm, much better than the conventional pitch of 300 μm between the through holes of the core layer) and fine-line wiring of the inter-layer conductive posts can be easily fabricated through the coreless circuit structure 24 so as to meet high I/O count and high wiring density requirements of large-size packages.

Further, the arrangement of the rigid layers (e.g., the first support member 22 and the second support member 26) and the insulating layers (e.g., the first insulating layer 23 and the second insulating layer 27) facilitates to increase the thickness and rigidity of the intermediate substrate 2, 2a, 2b, 2c and strengthen the coreless circuit structure 24. The intermediate substrate 2, 2a, 2b, 2c is formed with a strengthened sandwich rigid structure so as to meet the rigidity requirement, thereby effectively resisting warping. Compared with the prior art, the intermediate substrate 2, 2a, 2b, 2c is applicable to fabrication processes of large-size package products.

Furthermore, compared with the conventional packaging substrate that uses a circuit layer as an external heat conduction path, the present disclosure uses the first support member 22 and the second support member 26 as an external heat conduction path with a large area, thus improving heat dissipation. Further, when being used as an electrical connection, the first support member 22 and the second support member 26 can be connected to ground so as to improve the electrical property.

In addition, FIG. 2G-1 shows an electronic package 9 that is obtained by performing a packaging process on such as the intermediate substrate 2a of FIG. 2F-2. Therein, the coreless circuit structure 24 is defined with opposite first and second surfaces 24a, 24b, the first surface 24a of the coreless circuit structure 24 is bonded to the first insulating layer 23, and the second surface 24b of the coreless circuit structure 24 is bonded to the second insulating layer 27. The side with the first insulating layer 23 (i.e., the side with the second end surfaces 21b of the plurality of first conductive posts 21) serves as a chip mounting side S1, and the side with the second insulating layer 27 (i.e., the side with the second end surfaces 25b of the plurality of second conductive posts 25) serves as a circuit board mounting side S2. The plurality of first conductive posts 21 of the chip mounting side S1 is flip-chip bonded to at least a semiconductor chip 92 through a plurality of conductive bumps 93 containing a solder material, and the plurality of second conductive posts 25 of the circuit board mounting side S2 are bonded and electrically connected to a plurality of contacts 95 of a circuit board 9a through a plurality of solder balls 94.

FIG. 2G-2 shows another electronic package 9'. Referring to FIG. 2G-2, the chip mounting side S1 of the intermediate substrate 2a is flip-chip bonded to a TSI 91 arranged with a semiconductor chip 92 through a plurality of conductive bumps 93 containing a solder material, and the TSI 91 has a redistribution layer 911 flip-chip bonded to the semiconductor chip 92. As such, a large-size CoWoS type electronic package 9' is obtained.

Further, FIG. 2G-3 shows another electronic package 9". Referring to FIG. 2G-3, the second conductive posts 25' protruding from the surface of the second insulating layer 27 of the intermediate substrate 2b of FIG. 2F-3 are in direct electrical connection with the plurality of contacts 95 of the circuit board 9a by using a socket method. The socket method is preferred since it dispenses with the high temperature reflow process that otherwise could adversely affect the overall structure.

It should be noted that the side with the first insulating layer 23 can serve as a circuit board side and the side with the second insulating layer 27 can serve as a chip mounting side by exchanging the fabrication processes and adjusting the pitch between the conductive posts.

Therefore, since the coreless circuit structure 24 is coreless, ultra fine-line and high-density wiring required by large-size packages can be easily formed in the coreless circuit structure 24 so as to match the fine-pitch and fine-line specifications of the conductive bumps 93 of the semiconductor chip 92 or the TSI 91. As such, the outermost circuit layer 241' of the coreless circuit structure 24 can use the first conductive posts 21 as external contacts so as to meet the requirements of tens of thousands of contacts (I/O) of the semiconductor chip 92. Also, the rigidity of the intermediate substrate 2, 2a, 2b, 2c meets the requirement, thereby effectively resisting warping, avoiding cracking of the semiconductor chip 92, or preventing interlayer delamination of the carrier (e.g., the intermediate substrate 2, 2a, 2b, 2c) during a reliability verification that otherwise could cause electrical failure of the semiconductor chip 92.

Further, since the coreless circuit structure 24 is coreless, ultra fine-line and high-density wiring required by large-size packages corresponding to the circuit board 9a can be easily formed in the coreless circuit structure 24. Through suitable designs, the plurality of second conductive posts 25 of the outermost circuit layer 241" or the circuit board side S2 of the coreless circuit structure 24 can have an increased pitch t2 matching the pitch and line-width of the plurality of contacts 95 of the circuit board 9a. Compared with the prior art that needs to provide the circuit board 9a with fine pitch, high density and high layer number for assembly of large-size packages, the present disclosure allows the circuit board 9a to maintain the conventional design, thus greatly reducing the cost and effectively improving the yield.

Furthermore, through the design of fine-line and fine-pitch wiring in the coreless circuit structure 24, the pitch t2 between the second conductive posts 25 of the circuit board side S2 can be suitably adjusted (e.g., increased) to match the line width and spacing of the plurality of contacts 95 of the circuit board 9a that are most appropriate for mass production. Therefore, the present disclosure eliminates the need to perform an ultra fine-line process in a region of the circuit board 9a and allows the circuit board 9a to maintain the conventional structure and process. Compared with the prior art, the present disclosure eliminates the need to perform fine-line, fine-pitch and stack layer processes on the circuit board 9a according to the type of the large-size electronic package 9, 9', 9", thereby effectively simplifying the fabrication process and difficulty and reducing the cost.

FIGS. 3A to 3E-1 are schematic cross-sectional views illustrating a method for fabricating an intermediate substrate 3 according to a second embodiment of the present disclosure. The second embodiment differs from the first embodiment in fabrication of the conductive posts and the support members.

Figure 3A:
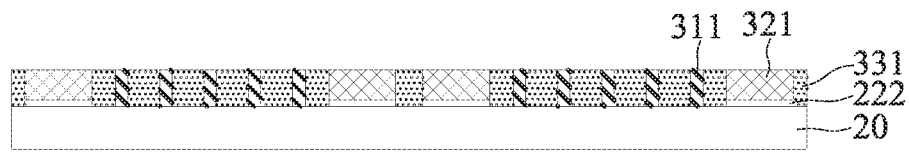

Referring to FIG. 3A, a plurality of first post bodies 311 and at least a first plate body 321 having a plurality of mesh-shaped openings are formed on a carrier 20, and then a first insulating sub-layer 331 is formed on the carrier 20 to encapsulate the plurality of first post bodies 311 and the first plate body 321. Then, a leveling process is performed such that the first insulating sub-layer 331 is flush with the plurality of first post bodies 311 and the first plate body 321, thereby exposing the plurality of first post bodies 311 and the first plate body 321.

Figures 1, 3B:
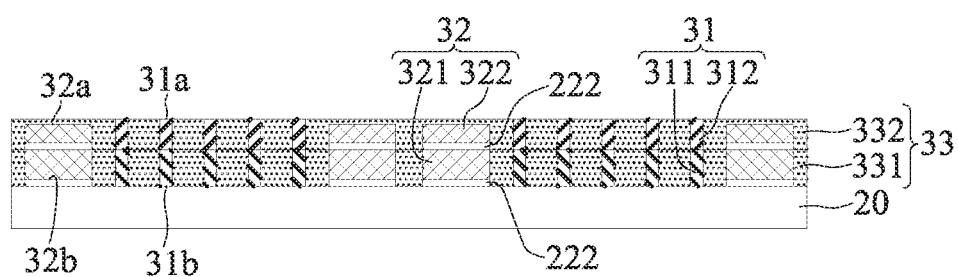
Figures 2, 3B:
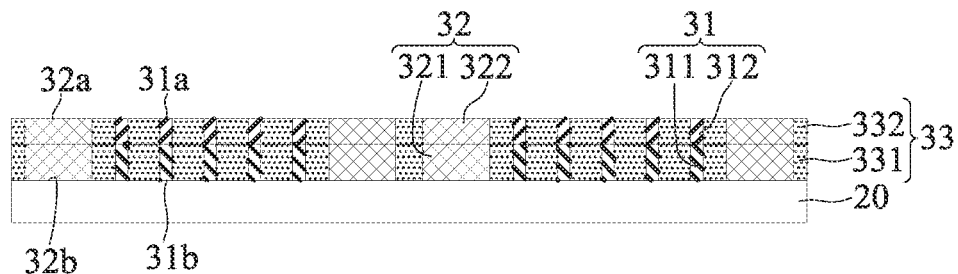

Referring to FIG. 3B-1, a plurality of second post bodies 312 butted with the first post bodies 311 and at least a second plate body 322 butted with the first plate body 321 and having a plurality of mesh-shaped openings are separately formed on the first insulating sub-layer 331, and then a second insulating sub-layer 332 is formed on the first insulating sub-layer 331 to encapsulate the plurality of second post bodies 312 and the second plate body 322. The first insulating sub-layer 331 and the second insulating sub-layer 332 constitute a first insulating layer 33. Then, a leveling process is performed such that the second insulating sub-layer 332 is flush with the plurality of second post bodies 312, thereby exposing the plurality of second post bodies 312. The first post bodies 311 and the second post bodies 312 are stacked on one another to form first conductive posts 31, and the first plate body 321 and the second plate body 322 are stacked on one another to form a first support member 32.

In an embodiment, the first post bodies 311 and the second post bodies 312 are fabricated in the same manner as the first conductive posts 21 of the first embodiment, the first plate body 321 and the second plate body 322 are fabricated in the same manner as the first support member 22 of the first embodiment, and the first insulating sub-layer 331 and the second insulating sub-layer 332 are fabricated in the same manner as the first insulating layer 23 of the first embodiment.

Further, based on the definition of the first embodiment, the first conductive posts 31 have opposite first and second end surfaces 31a, 31b, and the first support member 32 has opposite first and second sides 32a, 32b.

Alternatively, referring to FIG. 3B-2, in another embodiment, the first post bodies 311 and the first plate body 321 can be simultaneously formed by patterned electroplating, and the second post bodies 312 and the second plate body 322 can also be simultaneously formed by patterned electroplating.

Figures 1, 3C:
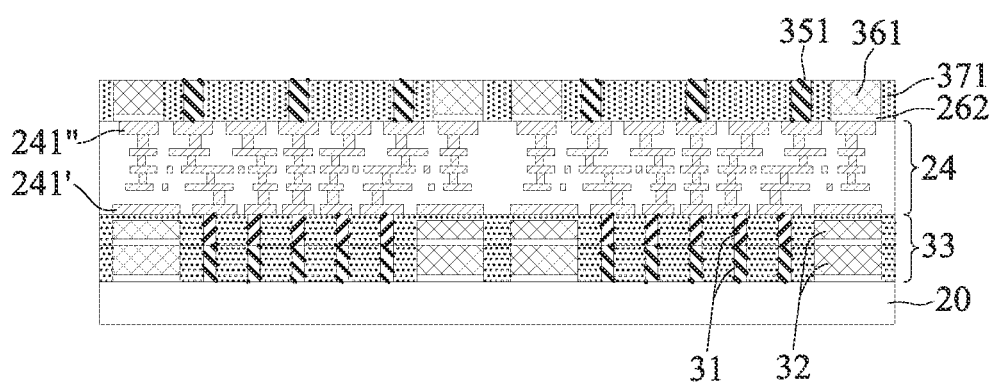
Figures 2, 3C:
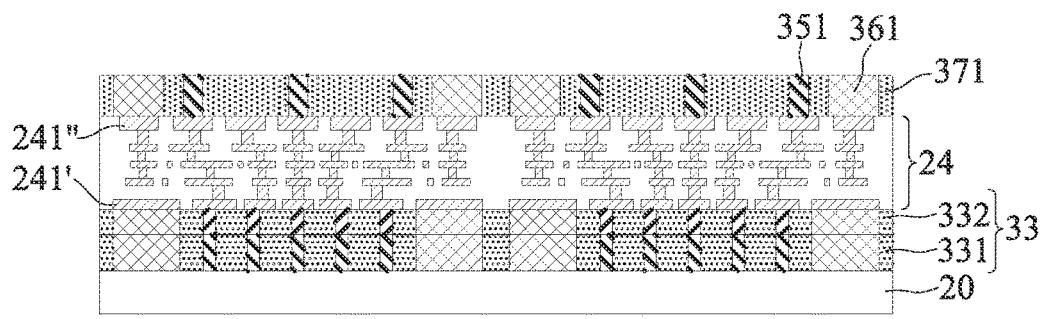

Referring to FIG. 3C-1, a coreless circuit structure 24 is formed on the first insulating layer 33, and a circuit layer 241' of the coreless circuit structure 24 is bonded to the first conductive posts 31. Referring to FIG. 3C-2, the circuit layer 241' of the coreless circuit structure 24 can further be bonded to the first support member 32. Then, a plurality of third post bodies 351 and a third plate body 361 having a plurality of mesh-shaped openings are formed on the coreless circuit structure 24, and a third insulating sub-layer 371 is formed on the coreless circuit structure 24 to encapsulate the plurality of third post bodies 351 and the third plate body 361. Then, a leveling process is performed such that the third insulating sub-layer 371 is flush with the plurality of third post bodies 351 and the third plate body 361, thereby exposing the plurality of third post bodies 351 and the third plate body 361.

Figures 1, 3D:
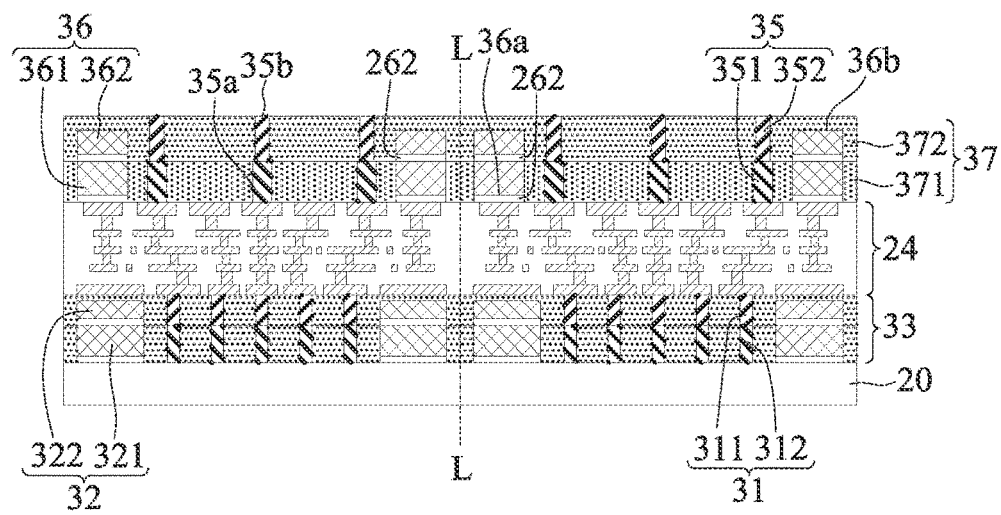
Figures 2, 3D:
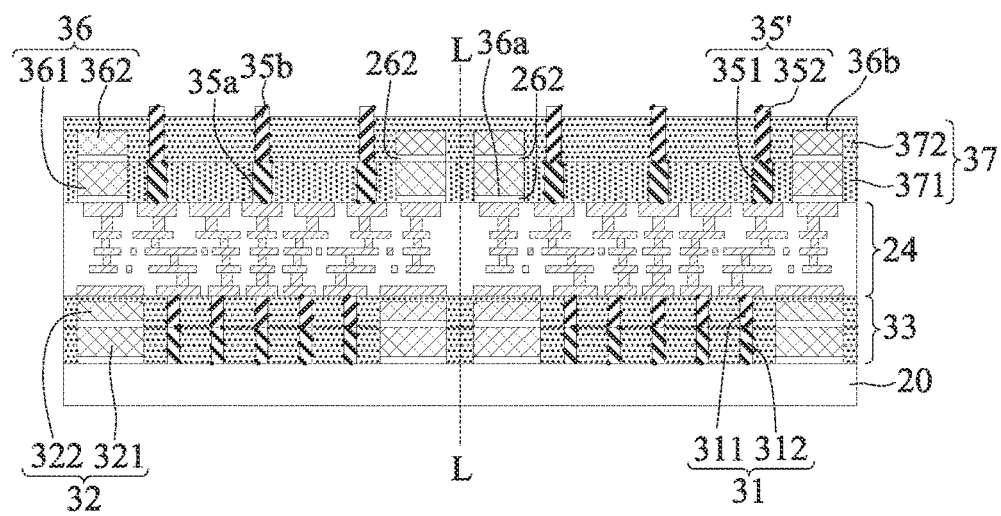
Figures 3, 3D:
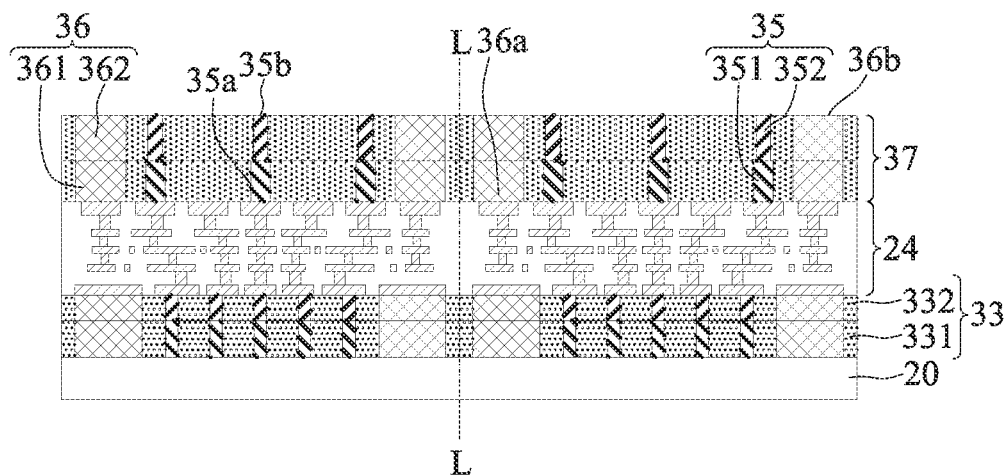

Referring to FIG. 3D-1, a plurality of fourth post bodies 352 butted with the third post bodies 351 and a fourth plate body 362 butted with the third plate body 361 and having a plurality of mesh-shaped openings are separately formed on the third insulating sub-layer 371, and then a fourth insulating sub-layer 372 is formed on the third insulating sub-layer 371 to encapsulate the plurality of fourth post bodies 352 and the fourth plate body 362. The third insulating sub-layer 371 and the fourth insulating sub-layer 372 constitute a second insulating layer 37. Then, a leveling process is performed such that the fourth insulating sub-layer 372 is flush with the plurality of fourth post bodies 352, thereby exposing the plurality of fourth post bodies 352. The third post bodies 351 and the fourth post bodies 352 are stacked on one another to form second conductive posts 35, and the third plate body 361 and the fourth plate body 362 are stacked on one another to form a second support member 36.

In an embodiment, the third post bodies 351 and the fourth post bodies 352 are fabricated in the same manner as the second conductive posts 25 of the first embodiment, the third plate body 361 and the fourth plate body 362 are fabricated in the same manner as the second support member 26 of the first embodiment, and the third insulating sub-layer 371 and the fourth insulating sub-layer 372 are fabricated in the same manner as the second insulating layer 27 of the first embodiment.

Further, the stacked and butted post bodies can have the same (e.g., the first post bodies 311 and the second post bodies 312) or different widths (e.g., the third post bodies 351 and the fourth post bodies 352). It should be understood that the width of the first post bodies 311 can be greater or less than the width of the second post bodies 312. In an aspect, if the conductive posts have three segments of post bodies, the width of the first post bodies 311 can be greater than, equal to or less than the width of the second post bodies 312.

Furthermore, based on the definition of the first embodiment, the second conductive posts 35 have opposite first and second end surfaces 35a, 35b, and the second support member 36 has opposite first and second sides 36a, 36b.

In addition, referring to FIG. 3D-2, the second insulating layer 37 can be partially removed by etching or laser ablation so as to cause the second end surfaces 35b of the second conductive posts 35' to protrude from the surface of the second insulating layer 37.

Referring to FIG. 3D-3, in another embodiment, the third post bodies 351 and the third plate body 361 can be simultaneously formed by patterned electroplating, and the fourth post bodies 352 and the fourth plate body 362 can also be simultaneously formed by patterned electroplating.

Figures 1, 3E:
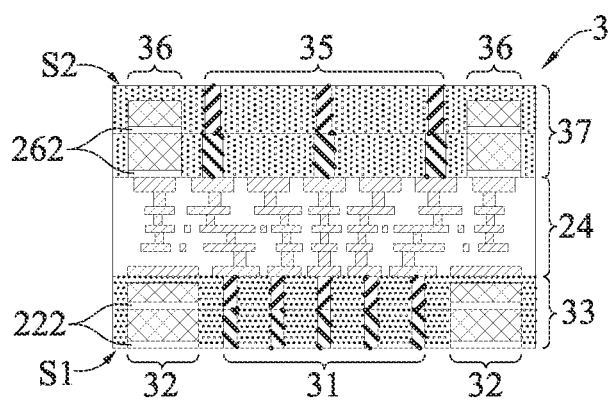
Figures 2, 3E:
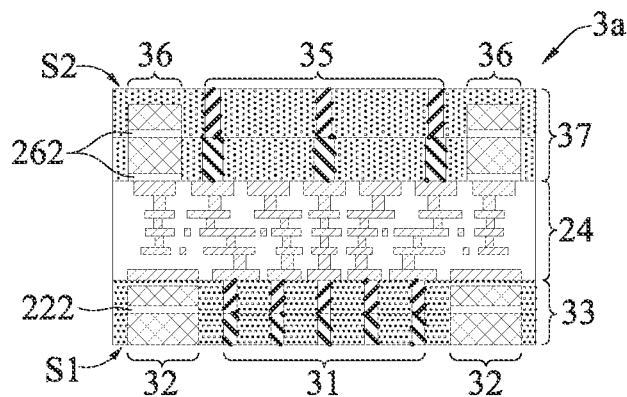
Figures 3, 3E:
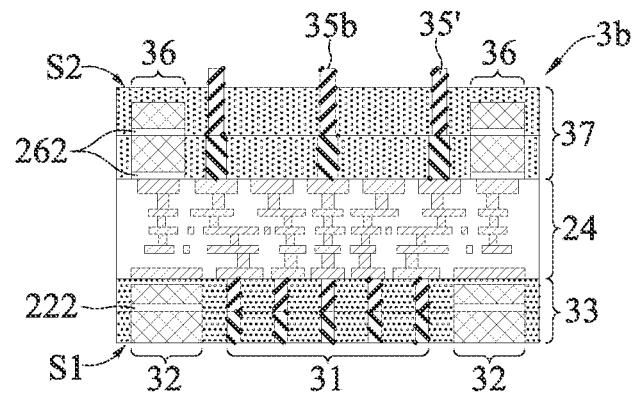
Figures 3, 3E, 4:
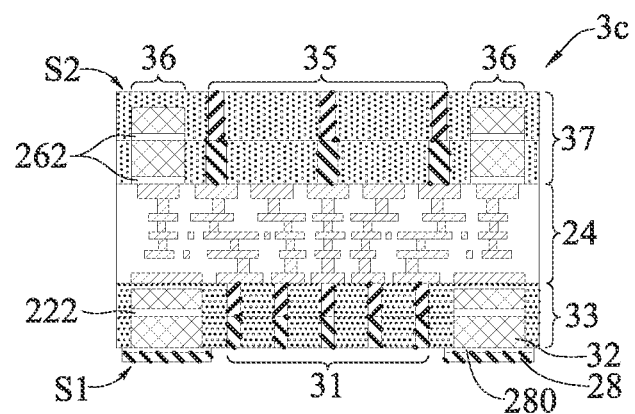

Referring to FIG. 3E-1, the carrier 20 is removed and a singulation process is performed along a cutting path L of FIG. 3D-1, thereby obtaining the intermediate substrate 3.

In an embodiment, after the carrier 20 is removed, the bonding layer 222 on the first plate body 321 can further be removed, thus obtaining an intermediate substrate 3a of FIG. 3E-2.

Further, referring to an intermediate substrate 3b of FIG. 3E-3, the second end surfaces 35b of the second conductive posts 35' protrude from the surface of the second insulating layer 37 so as to be exposed therefrom. Alternatively, referring to an intermediate substrate 3c of FIG. 3E-4, after the carrier 20 is removed, a heat dissipating element 28 as shown in FIG. 2F-5 is disposed on the surface of the first insulating layer 33.

FIGS. 4A to 4D-1 are schematic cross-sectional views illustrating a method for fabricating an intermediate substrate 4 according to a third embodiment of the present disclosure. The third embodiment differs from the first embodiment in fabrication of the second conductive posts 45 and the second support member 46.

Figure 4A:
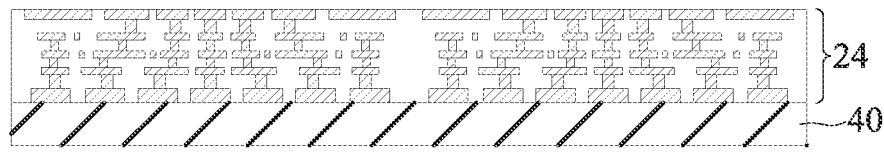

Referring to FIG. 4A, in the third embodiment, a carrier 40 is provided, which has a single layer of metal plate (in another embodiment, a plurality of layers of metal plates) such as a stainless steel plate, a high rigidity alloy plate (e.g., Fe—Ni alloy plate), a thick copper plate or a copper alloy plate. Then, a coreless circuit structure 24 is formed on the carrier 40 by using the method as described in the first embodiment. Therein, a circuit layer 241" of the coreless circuit structure 24 is directly bonded to the carrier 40.

Figures 1, 4B:
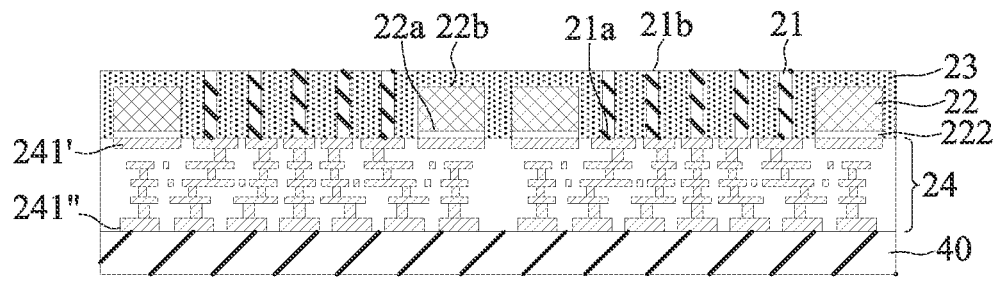
Figures 2, 4B:
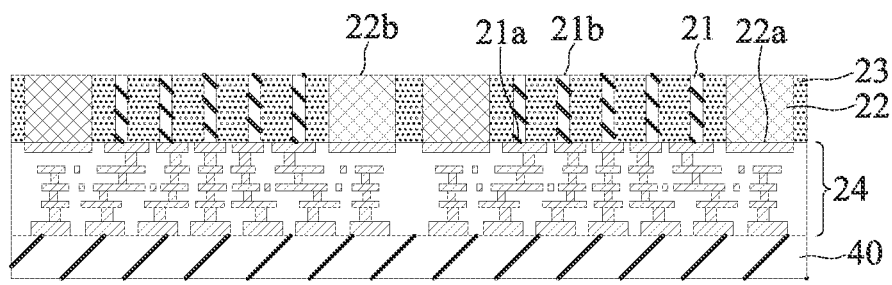

Referring to FIG. 4B-1, a plurality of first conductive posts 21, a first support member 22 having a plurality of mesh-shaped openings, and a first insulating layer 23 are formed on the coreless circuit structure 24.

In an embodiment, the plurality of first conductive posts 21 are formed on a circuit layer 241' of the coreless circuit structure 24 by patterned electroplating, and the first support member 22 is bonded to the coreless circuit structure 24 by attaching. Alternatively, referring to FIG. 4B-2, the plurality of first conductive posts 21 and the first support member 22 are simultaneously formed by patterned electroplating and directly bonded to the circuit layer 241' of the coreless circuit structure 24.

Based on the definition of the first embodiment, the first conductive posts 21 have opposite first and second end surfaces 21a, 21b, and the first support member 22 has opposite first and second sides 22a, 22b.

Figure 4C:
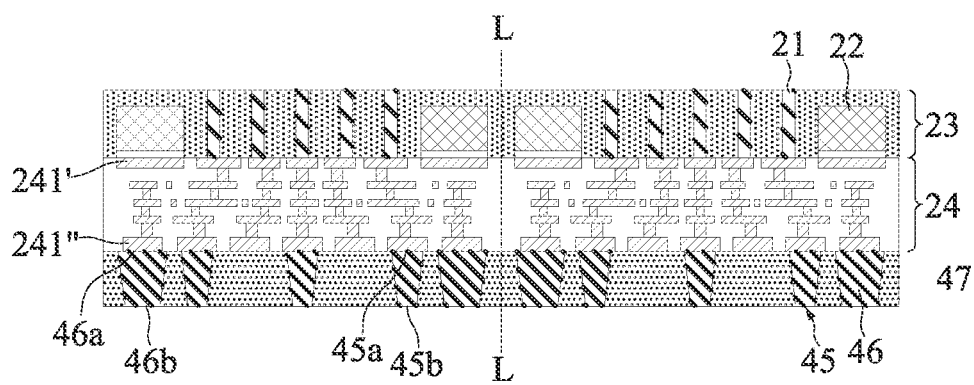

Referring to FIG. 4C, the carrier 40 is etched through a patterned etching process so as to form a plurality of second conductive posts 45 and a second support member 46 having a plurality of mesh-shaped openings. Then, a second insulating layer 47 is formed on the coreless circuit structure 24 to encapsulate the plurality of second conductive posts 45 and the second support member 46. Finally, a leveling process is performed such that the second insulating layer 47 is flush with the plurality of second conductive posts 45 and the second support member 46, thereby exposing one end surfaces of the plurality of second conductive posts 45 and one side of the second support member 46.

In an embodiment, based on the definition of the first embodiment, the second conductive posts 45 have opposite first and second end surfaces 45a, 45b, and the second support member 46 has opposite first and second sides 46a, 46b.

Figures 1, 4D:
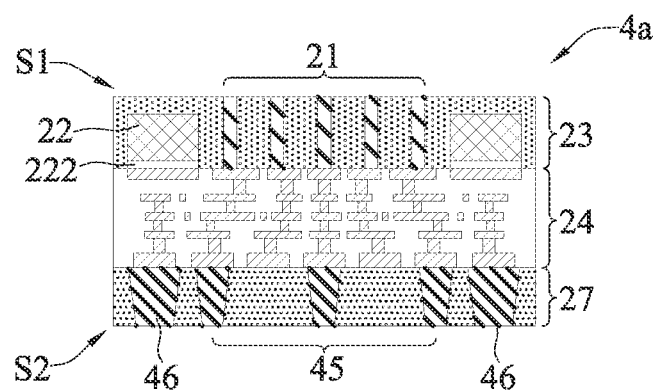
Figures 2, 4D:
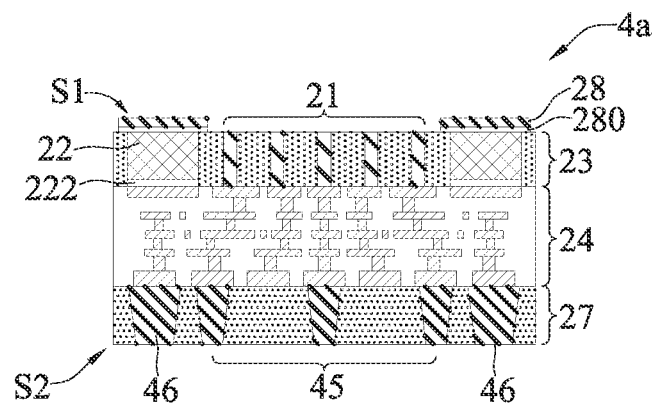

Referring to FIG. 4D-1, a singulation process is performed along a cutting path L of FIG. 4C to obtain the intermediate substrate 4. Therein, the side with the first conductive posts 21 (i.e., the side with the first insulating layer 23) serves as a chip mounting side S1 for flip-chip bonding with a chip or TSI, and the side with the second conductive posts 45 (i.e., the side with the second insulating layer 47) formed by etching serves as a circuit board mounting side S2 for bonding with a circuit board.

Further, referring to an intermediate substrate 4a of FIG. 4D-2, a heat dissipating element 28 as shown in FIG. 2F-5 can be disposed on the surface of the first insulating layer 23 (the chip mounting side S1) for improving heat dissipation (see also the first embodiment).

Figures 1, 5A:
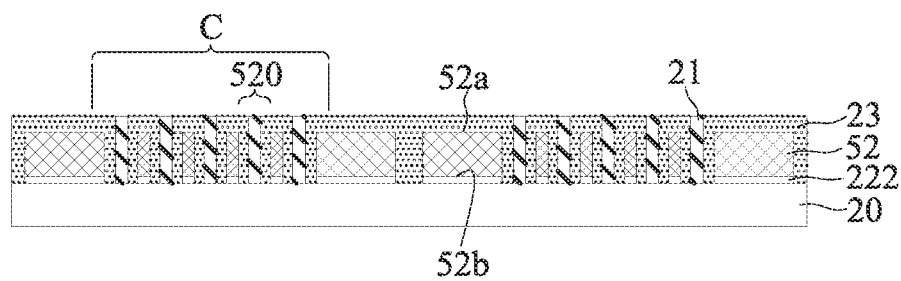
Figures 2, 5A:
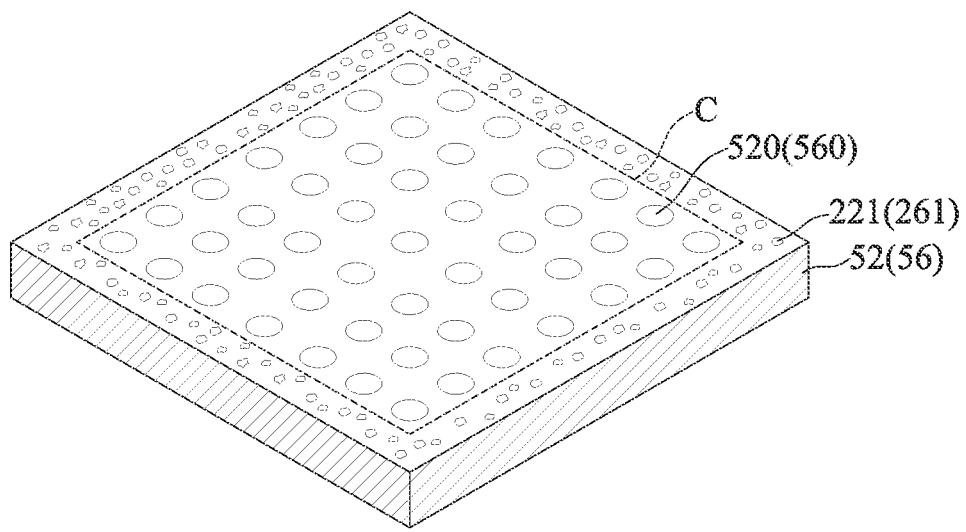
Figure 5B:
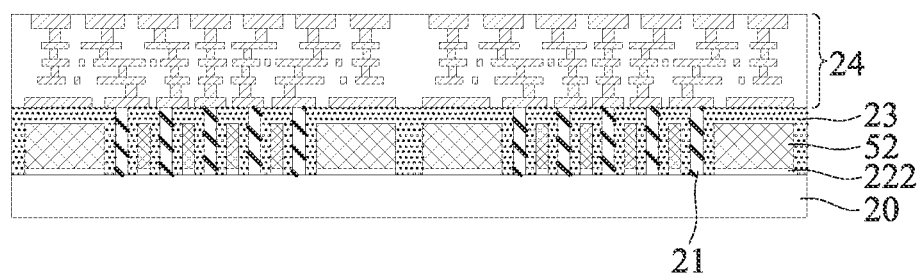
FIG. 5B is a schematic cross-sectional view illustrating one of steps of a method for fabricating an intermediate substrate.
Figure 5C:
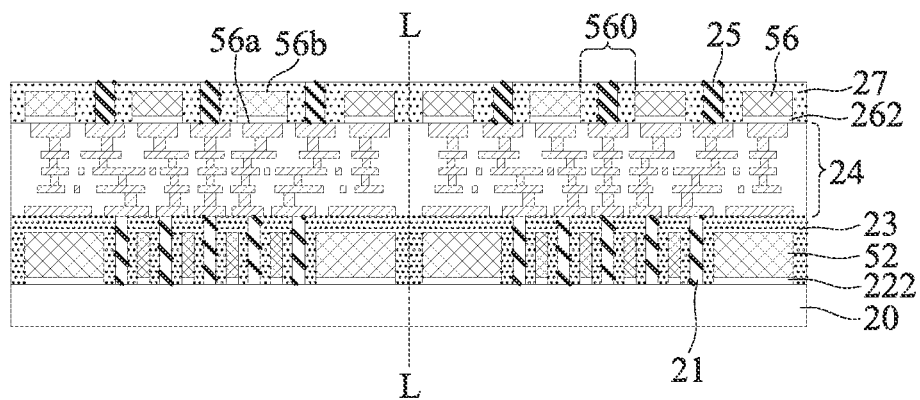
FIG. 5C is a schematic cross-sectional view illustrating one of steps of a method for fabricating an intermediate substrate.
Figures 1, 5D:
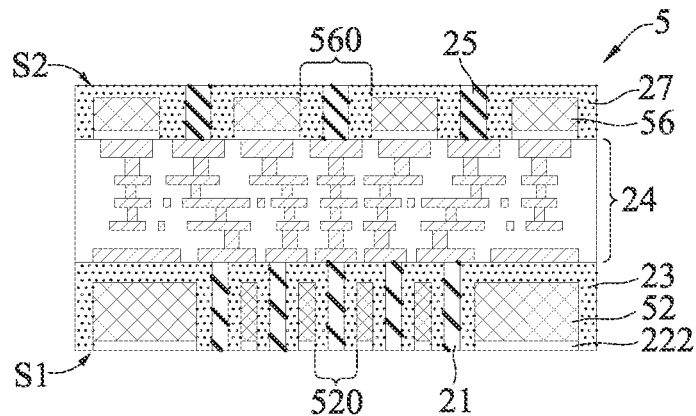
Figures 2, 5D:
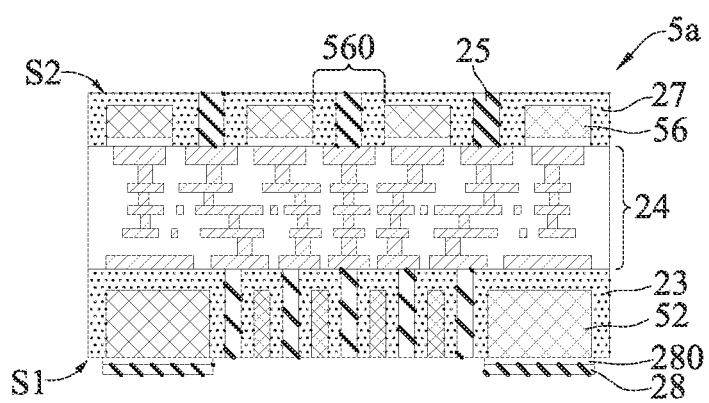
Figures 3, 5D:
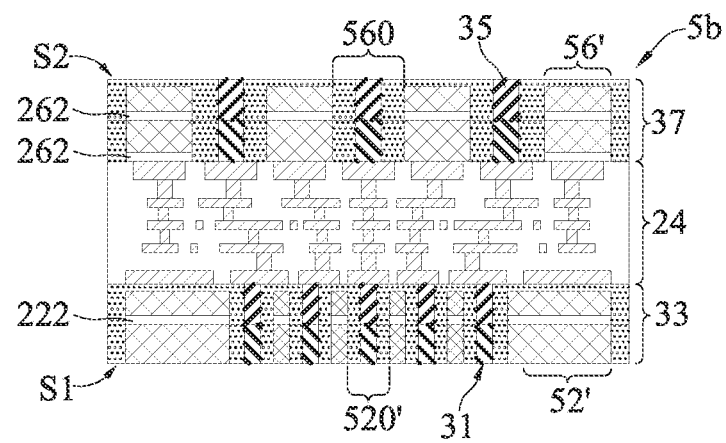
Figures 4, 5D:
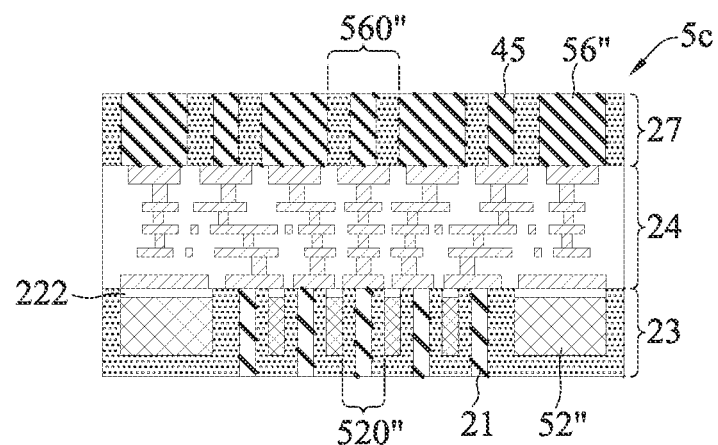

FIGS. 5A-1 to 5D-1 are schematic cross-sectional views illustrating a method for fabricating an intermediate substrate 5 according to a fourth embodiment of the present disclosure. The fourth embodiment differs from the above embodiments in the type of the mesh plate of the support member.

Referring to FIG. 5A-1, similar to the first embodiment, a plurality of first conductive posts 21 are formed on a carrier 20 by patterned electroplating, and a first support member 52 (as shown in FIG. 5A-2) having a plurality of mesh-shaped openings (large-sized openings 520 and small-sized openings 221) is attached onto the carrier 20. Further, a first insulating layer 23 is formed to encapsulate the first conductive posts 21 and the first support member 52. Therein, the openings 520 of the first support member 52 can have regular or irregular shapes and different sizes according to needs. Moreover, the first conductive posts 21 and the first support member 52 can be simultaneously formed by patterned electroplating.

In an embodiment, the first support member 52 is a mesh plate having a contact region C with the openings 520. The openings 520 correspond to the first conductive posts 21 so as for the first conductive posts 21 to be positioned in and protrude from the openings 520, respectively.

Further, based on the definition of the first embodiment, the first support member 52 has opposite first and second sides 52a, 52b.

Referring to FIG. 5B, a coreless circuit structure 24 is formed on the first conductive posts 21 and the first insulating layer 53.

Referring to FIG. 5C, a plurality of second conductive posts 25 are formed on the coreless circuit structure 24 by patterned electroplating, and a second support member 56 (as shown in FIG. 5A-2) having a plurality of mesh-shaped openings (large-sized openings 560 and small-sized openings 261) is attached onto the coreless circuit structure 24. Further, a second insulating layer 27 is formed to encapsulate the second conductive posts 25 and the second support member 56. Therein, the openings 560 of the second support member 56 can have regular or irregular shapes and different sizes according to needs. Moreover, the second conductive posts 25 and the second support member 56 can be simultaneously formed by patterned electroplating.

In an embodiment, the second support member 56 is a mesh plate having a contact region C with the openings 560. The openings 560 correspond to the second conductive posts 25 so as for the second conductive posts 25 to be positioned in and protrude from the openings 560, respectively.

Further, based on the definition of the first embodiment, the second support member 56 has opposite first and second sides 56a, 56b.

Referring to FIG. 5D-1, the carrier 20 and the bonding layer 222 are removed, and a singulation process is performed along a cutting path L of FIG. 5C to obtain the intermediate substrate 5.

Further, in an embodiment, referring to FIG. 5D-2, a heat dissipating member 28 as shown in FIGS. 2F-4 and 2F-5 can be applied so as to obtain an intermediate substrate 5a.

In an embodiment, the first support member 52/the second support member 56 is characterized in that the first conductive posts 21/the second conductive posts 25 are received in the openings 520/560, respectively. Such a characteristic is also applicable to the second embodiment (e.g., an intermediate substrate 5b of FIG. 5D-3, wherein the first support member 52' and the second support member 56' have a plurality of layers of plate bodies with a plurality of openings 520', 560') and the third embodiment (e.g., an intermediate substrate 5c of FIG. 5D-4, wherein the first support member 52" and the second support member 56" are mesh plate bodies having a plurality of openings 520", 560", and the second conductive posts 45 and the second support member 56" are formed by etching the carrier 20 through a patterned etching process).

Figure 6:
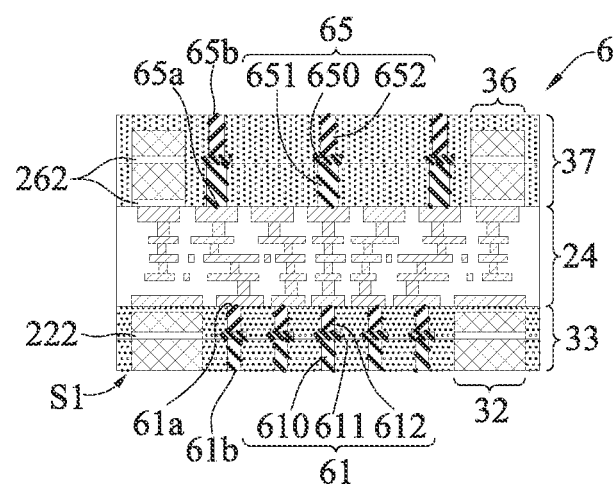
FIG. 6 is a schematic cross-sectional view of an intermediate substrate according to a fifth embodiment of the present disclosure.

FIG. 6 is a schematic cross-sectional view showing an intermediate substrate 6 according to a fifth embodiment of the present disclosure. The fifth embodiment differs from the above embodiments in fabrication of the conductive posts.

Referring to FIG. 6, the first conductive posts 61 have a plurality of layers of post bodies with land bodies 610 therebetween, and the second conductive posts 65 have a plurality of layers of post bodies with land bodies 650 therebetween.

In an embodiment, similar to the second embodiment, first post bodies 611, land bodies 610 and second post bodies 612 are sequentially formed by patterned electroplating on the carrier 20 in a stacking manner, and bonded together to form the first conductive posts 61. Since the first conductive posts 61 serve as a chip mounting side for bonding with a chip or TSI, the first conductive posts 61 need to meet a fine-pitch requirement. The multi-segment post bodies of the first conductive posts 61 facilitate to meet the fine-pitch requirement.

It should be understood that the second conductive posts 65 can also have multi-segment post bodies having land bodies 650. Third post bodies 651, land bodies 650 and fourth post bodies 652 are sequentially formed by patterned electroplating on a circuit layer of the coreless circuit structure 24 in a stacking manner, and bonded together to form the second conductive posts 65.

Further, based on the definition of the first embodiment, the first conductive posts 61 have opposite first and second end surfaces 61a, 61b, and the second conductive posts 65 have opposite first and second end surfaces 65a, 65b.

Further, before the singulation process of the above-described embodiments, a surface processing process can be performed on exposed portions of the conductive posts and the support members. The surface processing layer can be made of an alloy selected from the group including of nickel (Ni), palladium (Pd), gold (Au), tin (Sn), silver (Ag) and copper (Cu), multi-layers of metal or an organic solderability preservative (OSP), for example, electroplated Ni/Au, electroless Ni/Au, electroless nickel immersion gold (ENIG), electroless nickel electroless palladium immersion gold (ENEPIG), electroless tin (immersion tin) or pre-solder, etc.

It should be noted that the second support member (or the first support member) of the above embodiments can be designed as a thick metal layer so as to improve the rigidity and heat dissipation of the intermediate substrate.

According to the present disclosure, since the coreless circuit structure is coreless, fine-pitch, high-density and fine-line wiring can be easily fabricated through the coreless circuit structure so as to meet high I/O count and high wiring density requirements of large-size packages.

Further, through the arrangement of the first and second support members with good rigidity and suitable thickness and the first and second insulating layers, the intermediate substrate can meet the rigidity requirement so as to effectively resist warping and improve the quality, reliability and yield when a chip packaging process is performed on the intermediate substrate.

Furthermore, by using the coreless circuit structure, the present disclosure dispenses with a conductive through hole process as required in the prior art so as to overcome the conventional drawbacks.

In addition, the present disclosure allows regions requiring fine-line wiring for a circuit board to be designed in the coreless circuit structure and increases the pitch between the second conductive posts, thus overcoming the drawbacks of the conventional circuit board.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims

What is claimed is:

1. An intermediate substrate, comprising:
a coreless circuit structure having opposite first and second surfaces, wherein both the first and second surfaces have circuit layers exposed therefrom;
a plurality of first conductive posts having opposite first and second end surfaces, wherein the first conductive posts are bonded and electrically connected to the circuit layer exposed from the first surface of the coreless circuit structure via the first end surfaces of the first conductive posts;
a first support member being a plate body having a plurality of mesh-shaped openings and having opposite first and second sides, wherein the first support member is disposed on the first surface of the coreless circuit structure via the first side of the first support member, and the plurality of first conductive posts are positioned in at least one of the mesh-shaped openings of the first support member;
a first insulating layer formed on the first surface of the coreless circuit structure for encapsulating the plurality of first conductive posts and the first support member, wherein the second end surfaces of the plurality of first conductive posts are exposed from the first insulating layer;
a plurality of second conductive posts having opposite first and second end surfaces, wherein the plurality of second conductive posts are bonded and electrically connected to the circuit layer exposed from the second surface of the coreless circuit structure via the first end surfaces of the second conductive posts;
a second support member being a plate body having a plurality of mesh-shaped openings and having opposite first and second sides, wherein the second support member is disposed on the second surface of the coreless circuit structure via the first side of the second support member, and the plurality of second conductive posts are positioned in at least one of the mesh-shaped openings of the second support member; and
a second insulating layer formed on the second surface of the coreless circuit structure for encapsulating the plurality of second conductive posts and the second support member, wherein the second end surfaces of the plurality of second conductive posts are exposed from the second insulating layer.

2. The intermediate substrate of claim 1, wherein the second side of the first support member is exposed from the first insulating layer, and/or the second side of the second support member is exposed from the second insulating layer.

3. The intermediate substrate of claim 1, wherein at least one of the first conductive posts and the second conductive posts comprise a plurality of layers of post bodies stacked on one another.

4. The intermediate substrate of claim 1, wherein the first side of the first support member is bonded to the circuit layer exposed from the first surface of the coreless circuit structure, and/or the first side of the second support member is bonded to the circuit layer exposed from the second surface of the coreless circuit structure.

5. The intermediate substrate of claim 1, wherein at least one of the first support member and the second support member comprises a plurality of layers of plate bodies stacked on one another and each having a plurality of mesh-shaped openings.

6. The intermediate substrate of claim 1, wherein the plurality of first conductive posts are positioned in the mesh-shaped openings of the first support member, respectively, and/or the plurality of second conductive posts are positioned in the mesh-shaped openings of the second support member, respectively.

7. The intermediate substrate of claim 1, wherein the plurality of first conductive posts and the first support member are made of copper or copper alloy, and wherein the plurality of second conductive posts and the second support member are made of copper, copper alloy, stainless steel, or iron-nickel alloy.

8. The intermediate substrate of claim 1, wherein at least one of the first support member and the second support member is made of metal, organic resin, plastic steel, or ceramic insulating material.

9. The intermediate substrate of claim 1, wherein the second end surfaces of the plurality of first conductive posts serve as a chip mounting side for bonding with a chip or an interposer in a flip-chip manner, and the second end surfaces of the plurality of second conductive posts serve as a circuit board mounting side for bonding with a circuit board.

10. A method for fabricating an intermediate substrate, comprising:
providing a carrier;
forming a plurality of first conductive posts on the carrier by patterned electroplating;
forming a plate body-shaped first support member having a plurality of mesh-shaped openings to cause the plurality of first conductive posts to be positioned in at least one of the mesh-shaped openings of the first support member;
forming a first insulating layer on the carrier for encapsulating the plurality of first conductive posts and the first support member;
leveling the first insulating layer, wherein one end surfaces of the plurality of first conductive posts are exposed from a surface of the first insulating layer;
forming a coreless circuit structure having at least one circuit layer on the first insulating layer, the plurality of first conductive posts and the first support member by a build-up process to bond the circuit layer of the coreless circuit structure to one end surface of the plurality of first conductive posts;
forming a plurality of second conductive posts on the coreless circuit structure by patterned electroplating;
forming a plate body-shaped second support member having a plurality of mesh-shaped openings to cause the plurality of second conductive posts to be positioned in at least one of the mesh-shaped openings of the second support member and bond one end surfaces of the plurality of second conductive posts to the circuit layer of the coreless circuit structure;
forming a second insulating layer on the coreless circuit structure for encapsulating the plurality of second conductive posts and the second support member;
leveling the second insulating layer, wherein the other end surfaces of the plurality of second conductive posts are exposed from a surface of the second insulating layer; and
removing the carrier to expose the other end surfaces of the plurality of first conductive posts from the first insulating layer.

11. The method of claim 10, wherein the first support member and the plurality of first conductive posts are simultaneously formed on the carrier by patterned electroplating, and the first conductive posts comprise a single layer of post body or a plurality of layers of post bodies stacked on one another, and/or the first support member comprises a single layer of plate body having a plurality of mesh-shaped openings or a plurality of layers of plate bodies stacked on one another and having a plurality of mesh-shaped openings.

12. The method of claim 10, wherein the plurality of first conductive posts are formed on the carrier by patterned electroplating first and then the first support member having the plurality of mesh-shaped openings is bonded onto the carrier via an adhesive material, wherein the first conductive posts comprise a single layer of post body or a plurality of layers of post bodies stacked on one another, and/or the first support member comprises a single layer of plate body having a plurality of mesh-shaped openings or a plurality of layers of plate bodies stacked on one another and having a plurality of mesh-shaped openings; or the first support member having the plurality of mesh-shaped openings is bonded onto the carrier via an adhesive material first and then the plurality of first conductive posts are formed on the carrier by patterned electroplating, wherein the first conductive posts comprise a single layer of post body or a plurality of layers of post bodies stacked on one another, and/or the first support member comprises a single layer of plate body having a plurality of mesh-shaped openings or a plurality of layers of plate bodies stacked on one another and having a plurality of mesh-shaped openings.

13. The method of claim 10, wherein the second support member and the plurality of second conductive posts are simultaneously formed on the circuit layer of one surface of the coreless circuit structure by patterned electroplating, and the second conductive posts comprise a single layer of post body or a plurality of layers of post bodies stacked on one another, and/or the second support member comprises a single layer of plate body having a plurality of mesh-shaped openings or a plurality of layers of plate bodies stacked on one another and having a plurality of mesh-shaped openings.

14. The method of claim 10, wherein the plurality of second conductive posts are formed on the circuit layer of one surface of the coreless circuit structure by patterned electroplating first and then the second support member having the plurality of mesh-shaped openings is bonded onto the circuit layer of one surface of the coreless circuit structure via an adhesive material, wherein the second conductive posts comprise a single layer of post body or a plurality of layers of post bodies stacked on one another, and/or the second support member comprises a single layer of plate body having a plurality of mesh-shaped openings or a plurality of layers of plate bodies stacked on one another and having a plurality of mesh-shaped openings; or the second support member having the plurality of mesh-shaped openings is bonded onto the circuit layer of one surface of the coreless circuit structure via an adhesive material first and then the plurality of second conductive posts are formed on the circuit layer of one surface of the coreless circuit structure by patterned electroplating, wherein the second conductive posts comprise a single layer of post body or a plurality of layers of post bodies stacked on one another, and/or the second support member comprises a single layer of plate body having a plurality of mesh-shaped openings or a plurality of layers of plate bodies stacked on one another and having a plurality of mesh-shaped openings.

15. The method of claim 10, wherein the plurality of first conductive posts are positioned in the mesh-shaped openings of the first support member, respectively, and/or the plurality of second conductive posts are positioned in the mesh-shaped openings of the second support member, respectively.

16. The method of claim 10, wherein one side of the first support member is exposed from the first insulating layer, and/or one side of the second support member is exposed from the second insulating layer.

17. A method for fabricating an intermediate substrate, comprising:
providing a carrier, wherein the carrier is a plate body made of copper, copper alloy, stainless steel, or iron-nickel alloy;

forming a coreless circuit structure having a plurality of circuit layers on the carrier via a build-up process, wherein at least one of the circuit layers of the coreless circuit structure is bonded onto the carrier;

forming a plurality of first conductive posts on one of the circuit layers of the coreless circuit structure by patterned electroplating;

forming a plate body-shaped first support member having a plurality of mesh-shaped openings to cause the plurality of first conductive posts to be positioned in at least one of the mesh-shaped openings of the first support member;

forming a first insulating layer on the coreless circuit structure for encapsulating the plurality of first conductive posts and the first support member;

leveling the first insulating layer, wherein one end surfaces of the plurality of first conductive posts are exposed from a surface of the first insulating layer;

patterned etching the carrier to form a plurality of second conductive posts and a second support member, wherein the second support member is a plate body having a plurality of mesh-shaped openings and the plurality of second conductive posts are positioned in at least one of the mesh-shaped openings of the second support member;

forming a second insulating layer on the coreless circuit structure for encapsulating the plurality of second conductive posts and the second support member; and leveling the second insulating layer, wherein one end surfaces of the plurality of second conductive posts are exposed from a surface of the second insulating layer.

18. The method of claim 17, wherein one side of the first support member is exposed from the first insulating layer, and/or one side of the second support member is exposed from the second insulating layer.

19. The method of claim 17, wherein the first support member and the plurality of first conductive posts are simultaneously formed on the circuit layers of the coreless circuit structure by patterned electroplating, and the first conductive posts comprise a single layer of post body or a plurality of layers of post bodies stacked on one another, and/or the second support member comprises a single layer of plate body or a plurality of layers of plate bodies stacked on one another.

20. The method of claim 17, wherein the plurality of first conductive posts are formed on one of the circuit layers of the coreless circuit structure by patterned electroplating first and then the first support member is bonded onto one of the circuit layers of the coreless circuit structure via an adhesive material, wherein the first conductive posts comprise a single layer of post body or a plurality of layers of post bodies stacked on one another, and the first support member comprises a single layer of plate body or a plurality of layers of plate bodies stacked on one another; or the first support member is bonded onto one of the circuit layers of the coreless circuit structure via an adhesive material first and then the plurality of first conductive posts are formed on one of the circuit layers of the coreless circuit structure by patterned electroplating, wherein the first conductive posts comprise a single layer of post body or a plurality of layers of post bodies stacked on one another, and the first support member comprises a single layer of plate body or a plurality of layers of plate bodies stacked on one another.

21. The method of claim 17, wherein the plurality of first conductive posts are positioned in the mesh-shaped openings of the first support member, respectively, and/or the plurality of second conductive posts are positioned in the mesh-shaped openings of the second support member, respectively.

* * * * *